US009997412B1

(12) United States Patent
Bae et al.

(10) Patent No.: US 9,997,412 B1
(45) Date of Patent: Jun. 12, 2018

(54) METHODS OF MANUFACTURING SEMICONDUCTOR DEVICES

(71) Applicant: SAMSUNG ELECTRONICS CO., LTD., Suwon-si, Gyeonggi-do (KR)

(72) Inventors: Ki Ho Bae, Seoul (KR); Jaeseok Kim, Seoul (KR); Hoyoung Kim, Seongnam-si (KR); Boun Yoon, Seoul (KR); KyungTae Lee, Seoul (KR); Kwansung Kim, Yongin-si (KR); Eunji Park, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/646,300

(22) Filed: Jul. 11, 2017

(30) Foreign Application Priority Data

Dec. 9, 2016 (KR) .......................... 10-2016-0167856

(51) Int. Cl.
H01L 21/768 (2006.01)
H01L 21/8234 (2006.01)
(Continued)

(52) U.S. Cl.
CPC .. H01L 21/823475 (2013.01); H01L 21/3212 (2013.01); H01L 21/7684 (2013.01);
(Continued)

(58) Field of Classification Search
CPC ..... H01L 21/823475; H01L 21/823418; H01L 21/823437; H01L 21/76897;
(Continued)

(56) References Cited

U.S. PATENT DOCUMENTS 6,528,418 B1 * 3/2003 Kim .................. H01L 21/76897
257/E21.507
6,858,452 B2 * 2/2005 Park .................... H01L 21/3212
257/E21.304

(Continued)

FOREIGN PATENT DOCUMENTS

JP 2003-115488 A 4/2003
KR 10-2006-0030720 A 4/2006
KR 10-2009-0083773 A 8/2009

Primary Examiner — Michael Trinh
(74) Attorney, Agent, or Firm — Lee & Morse, P.C.

(57) ABSTRACT

A method of manufacturing a semiconductor device includes forming on a substrate gate electrodes extending in a first direction and spaced apart from each other in a second direction, forming capping patterns on the gate electrodes, forming interlayer dielectric layer filling spaces between adjacent gate electrodes, forming a hardmask on the interlayer dielectric layer with an opening selectively exposing second to fourth capping patterns, using the hardmask as an etch mask to form holes in the interlayer dielectric layer between the second and third gate electrodes and between the third and fourth gate electrodes, forming a barrier layer and a conductive layer in the holes, performing a first planarization to expose the hardmask, performing a second planarization to expose a portion of the barrier layer covering the second to fourth capping patterns, and performing a third planarization to completely expose the first to fourth capping patterns.

20 Claims, 42 Drawing Sheets

(51) Int. Cl.
*H01L 23/522* (2006.01)
*H01L 21/321* (2006.01)
*H01L 29/66* (2006.01)

(52) U.S. Cl.
CPC .............. *H01L 21/76897* (2013.01); *H01L 21/823418* (2013.01); *H01L 21/823437* (2013.01); *H01L 23/5226* (2013.01); *H01L 29/66545* (2013.01)

(58) Field of Classification Search
CPC ............ H01L 21/7684; H01L 21/3212; H01L 29/66545; H01L 23/5226
See application file for complete search history.

(56) References Cited

U.S. PATENT DOCUMENTS

| | | | |
|---|---|---|---|
| 7,094,672 B2 * | 8/2006 | Chen ................. | H01L 21/76897 257/E21.507 |
| 7,119,015 B2 | 10/2006 | Park et al. | |
| 8,367,553 B2 | 2/2013 | Tsao et al. | |
| 9,245,894 B2 * | 1/2016 | Lytle ................... | H01L 29/665 |
| 9,443,738 B2 | 9/2016 | Zang et al. | |
| 2006/0154460 A1 * | 7/2006 | Yun ................... | H01L 21/76897 438/586 |
| 2007/0221998 A1 * | 9/2007 | Park ..................... | H01L 27/105 257/382 |
| 2009/0305501 A1 | 12/2009 | Lee et al. | |
| 2016/0225898 A1 | 8/2016 | Mallikarjunaswamy | |
| 2016/0247724 A1 | 8/2016 | Banna | |

* cited by examiner

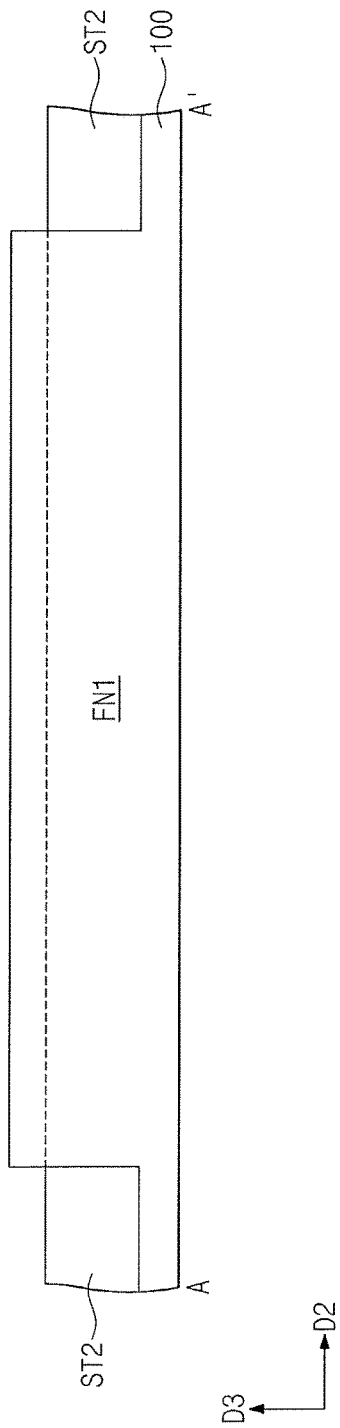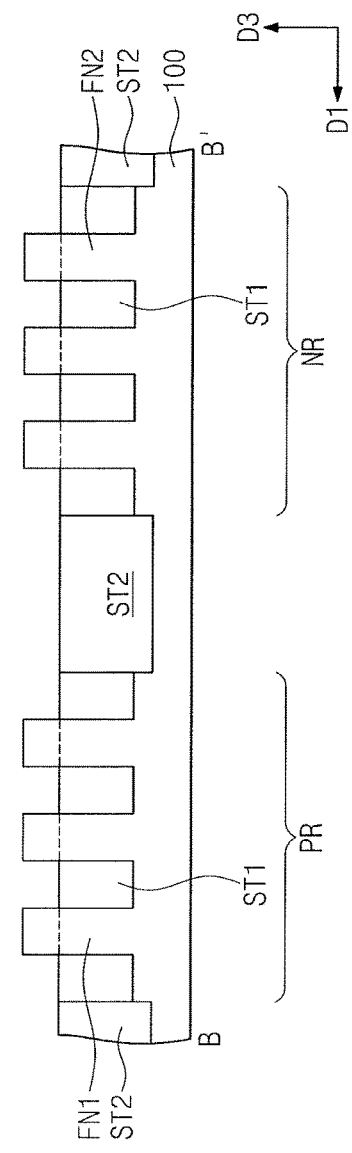
FIG. 4A
FIG. 4B

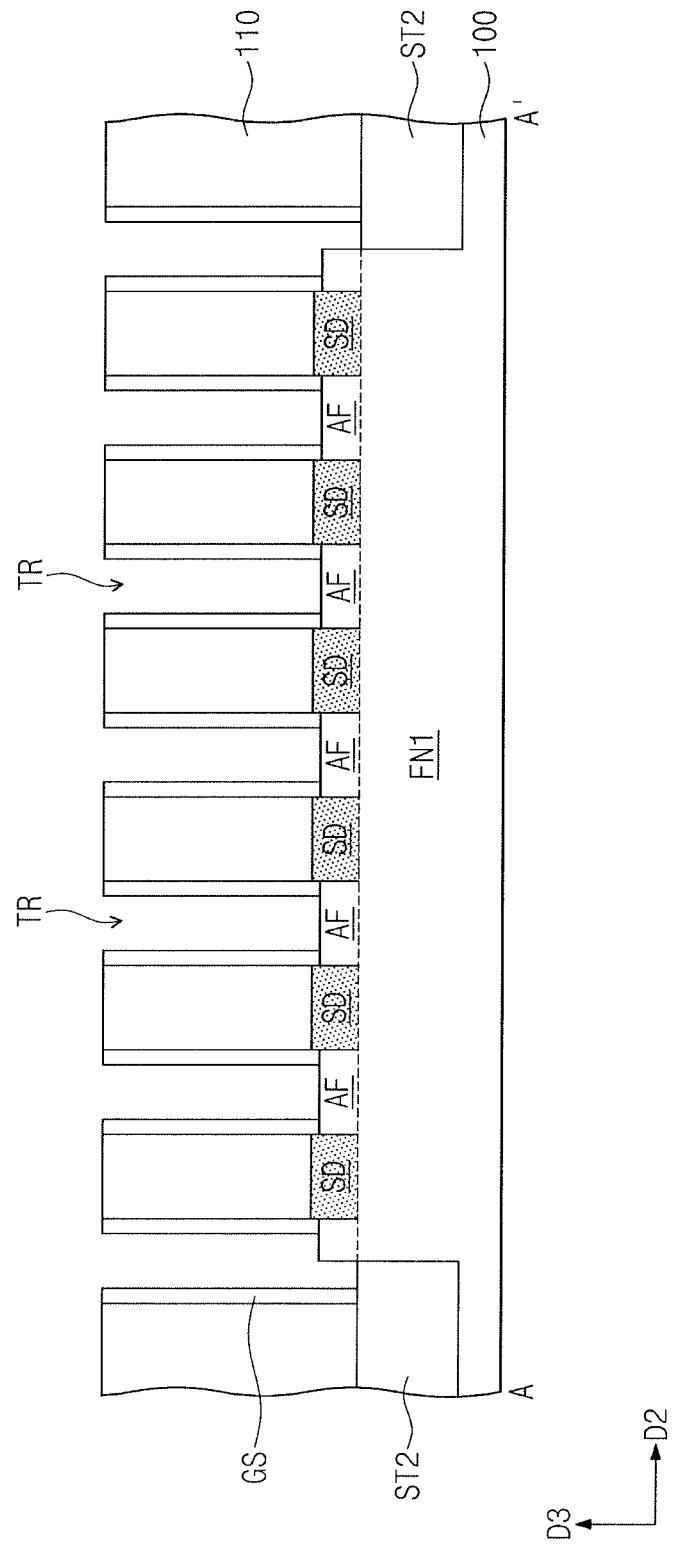

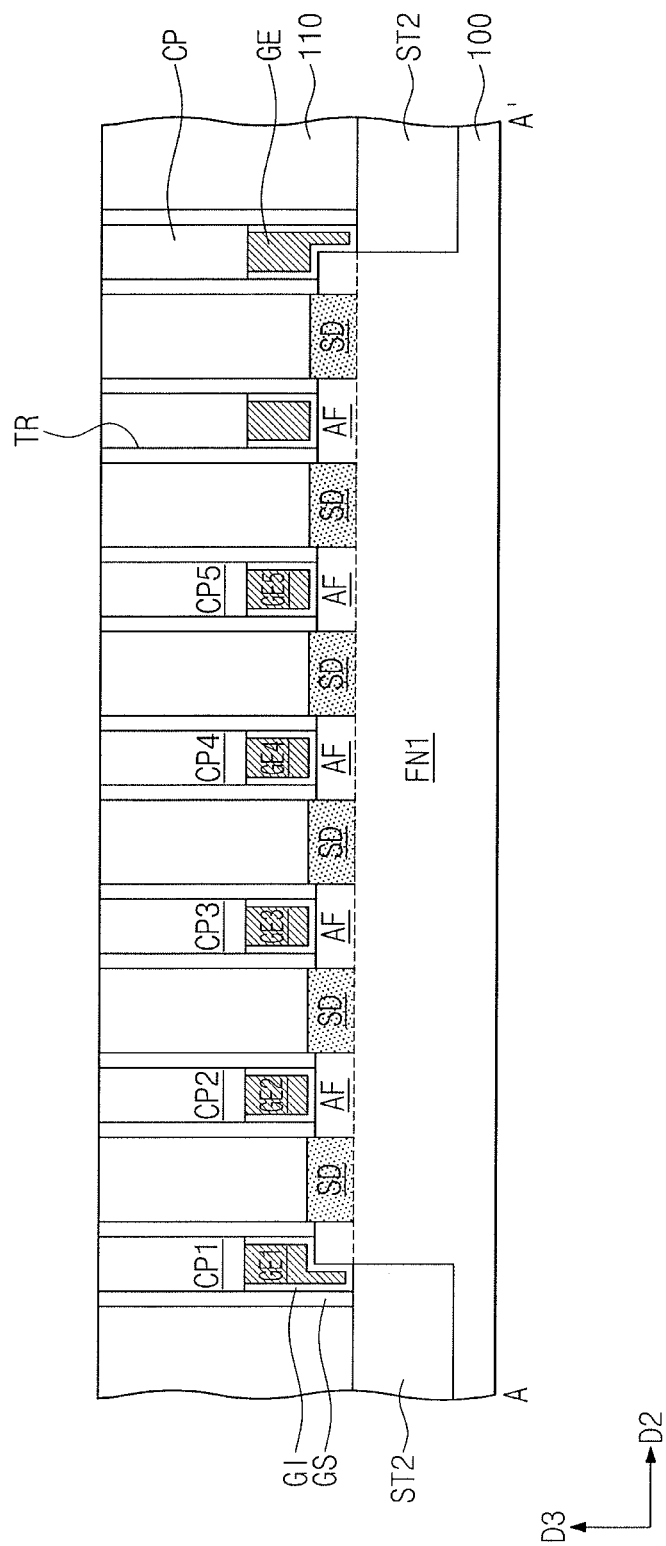

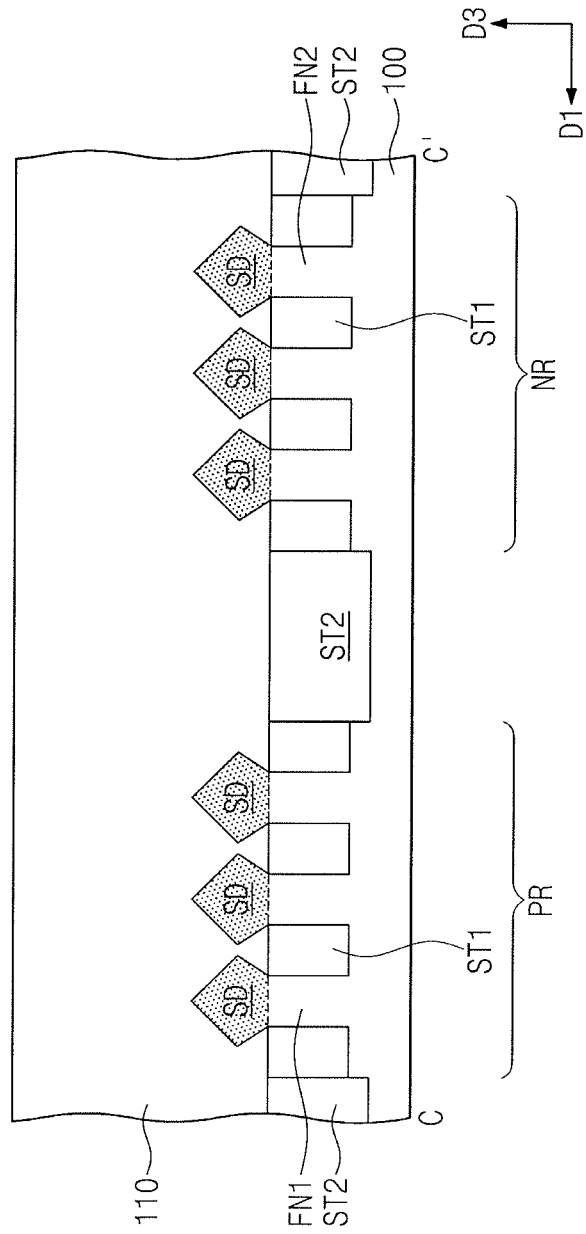

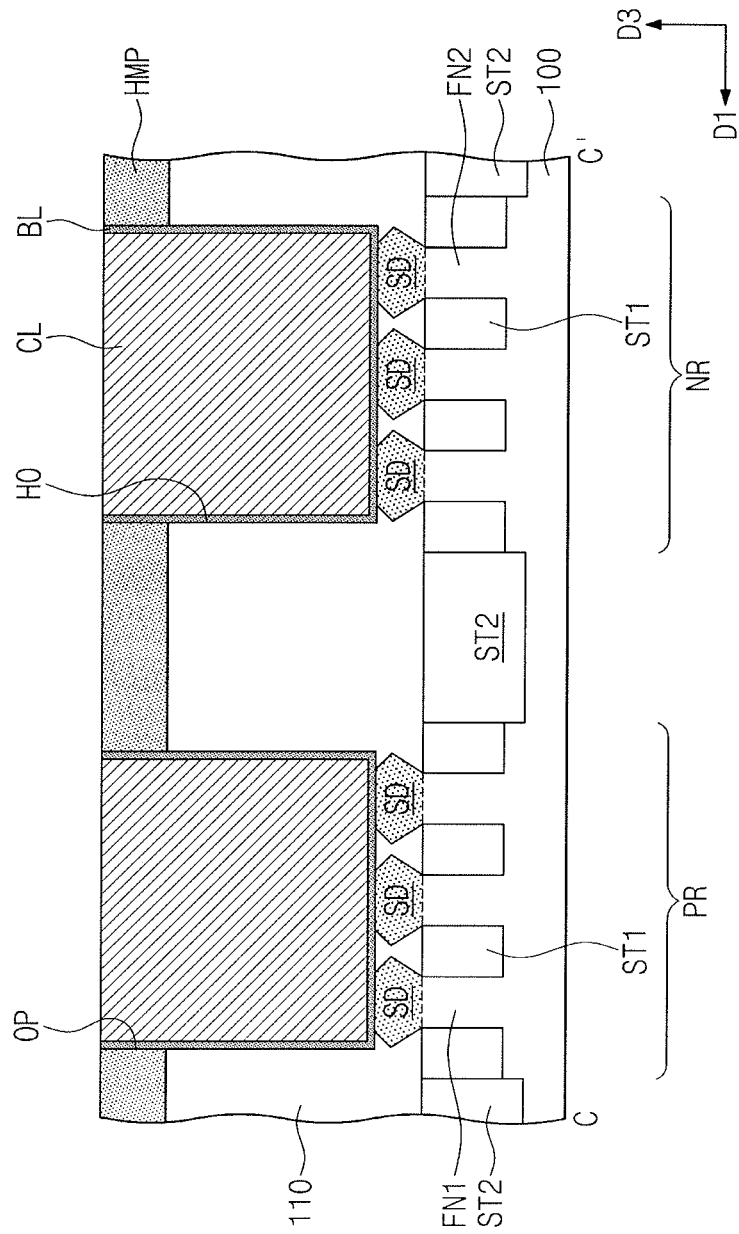

METHODS OF MANUFACTURING SEMICONDUCTOR DEVICES

CROSS-REFERENCE TO RELATED APPLICATIONS

Korean Patent Application No. 10-2016-0167856, filed on Dec. 9, 2016, in the Korean Intellectual Property Office, and entitled: "Methods of Manufacturing Semiconductor Devices," is incorporated by reference herein in its entirety.

BACKGROUND

1. Field

The present disclosure relates to a method of manufacturing a semiconductor device, and more particularly, to a method of manufacturing a semiconductor device including a self-aligned contact.

2. Description of the Related Art

Semiconductor devices are considered to be an important factor in electronic industry because of their small size, multi-function, and/or low fabrication cost. The semiconductor devices may be categorized as any one of semiconductor memory devices storing logic data, semiconductor logic devices processing operations of logic data, and hybrid semiconductor devices having both memory and logic elements. The semiconductor devices have been increasingly required for high integration with the advanced development of the electronic industry. For example, the semiconductor devices have been increasingly requested for high reliability, high speed, and/or multifunction. The semiconductor devices are gradually becoming more complex and highly integrated to meet these requested characteristics.

SUMMARY

According to exemplary embodiments, a method of manufacturing a semiconductor device may include forming on a substrate first to fourth gate electrodes adjacent to each other, the first to fourth gate electrodes extending in a first direction and being arranged in a second direction crossing the first direction, forming first to fourth capping patterns on the first to fourth gate electrodes, respectively, forming an interlayer dielectric layer filling spaces between the first to fourth gate electrodes, forming a hardmask pattern on the interlayer dielectric layer, the hardmask pattern including an opening that selectively exposes the second to fourth capping patterns, forming holes by using the hardmask pattern as an etch mask to etch the interlayer dielectric layer between the second and third gate electrodes and between the third and fourth gate electrodes, sequentially forming a barrier layer and a conductive layer that fill the holes, performing a first planarization process until the hardmask pattern is exposed, performing a second planarization process until exposing a portion of the barrier layer, the portion of the barrier layer covering the second to fourth capping patterns, and performing a third planarization process until completely exposing the first to fourth capping patterns.

According to exemplary embodiments, a method of manufacturing a semiconductor device may include forming gate structures on a substrate, forming an interlayer dielectric layer filling spaces between the gate structures, forming on the interlayer dielectric layer a hardmask pattern partially exposing the gate structures, etching the interlayer dielectric layer using the hardmask pattern as an etch mask, sequentially forming a barrier layer and a conductive layer on an entire surface of the substrate; performing a first planarization process until the hardmask pattern is exposed, performing a second planarization process until exposing a portion of the barrier layer, the portion of the barrier layer covering top surfaces of the gate structures, and performing a third planarization process until completely exposing capping patterns of the gate structures. When the barrier layer and the conductive layer are formed, the gate structures may have uppermost heights different from each other.

According to exemplary embodiments, a method of manufacturing a semiconductor device may include forming on a substrate first to fourth gate electrodes adjacent to each other, the first to fourth gate electrodes extending in a first direction and being spaced apart from each other in a second direction crossing the first direction, forming first to fourth capping patterns on the first to fourth gate electrodes, respectively, forming an interlayer dielectric layer filling spaces between adjacent ones of the first to fourth gate electrodes, forming a hardmask pattern on the interlayer dielectric layer, the hardmask pattern including an opening that selectively exposes the second to fourth capping patterns, forming holes by using the hardmask pattern as an etch mask to etch the interlayer dielectric layer between the second and third gate electrodes and between the third and fourth gate electrodes, sequentially forming a barrier layer and a conductive layer that fill the holes, performing a first planarization process until the hardmask pattern is exposed, performing a second planarization process until a portion of the barrier layer is exposed, the portion of the barrier layer covering the second to fourth capping patterns, and performing a third planarization process until the first to fourth capping patterns are completely exposed, wherein each of the first through third planarization process is performed using a different slurry composition.

BRIEF DESCRIPTION OF THE DRAWINGS

Features will become apparent to those of ordinary skill in the art by describing in detail exemplary embodiments with reference to the attached drawings, in which:

FIGS. 4A, 6A, 8A, 10A, 12A, 14A, 16A, 18A, 20A, and 22A illustrate cross-sectional views along line A-A' of FIGS. 3, 5, 7, 9, 11, 13, 15, 17, 19, and 21, respectively.

FIGS. 4B, 6B, 8B, 10B, 12B, 14B, 16B, 18B, 20B, and 22B illustrate cross-sectional views along line B-B' of FIGS. 3, 5, 7, 9, 11, 13, 15, 17, 19, and 21, respectively.

FIGS. 6C, 8C, 10C, 12C, 14C, 16C, 18C, 20C, and 22C illustrate cross-sectional views along line C-C' of FIGS. 5, 7, 9, 11, 13, 15, 17, 19, and 21, respectively.

DETAILED DESCRIPTION

Figure 1:
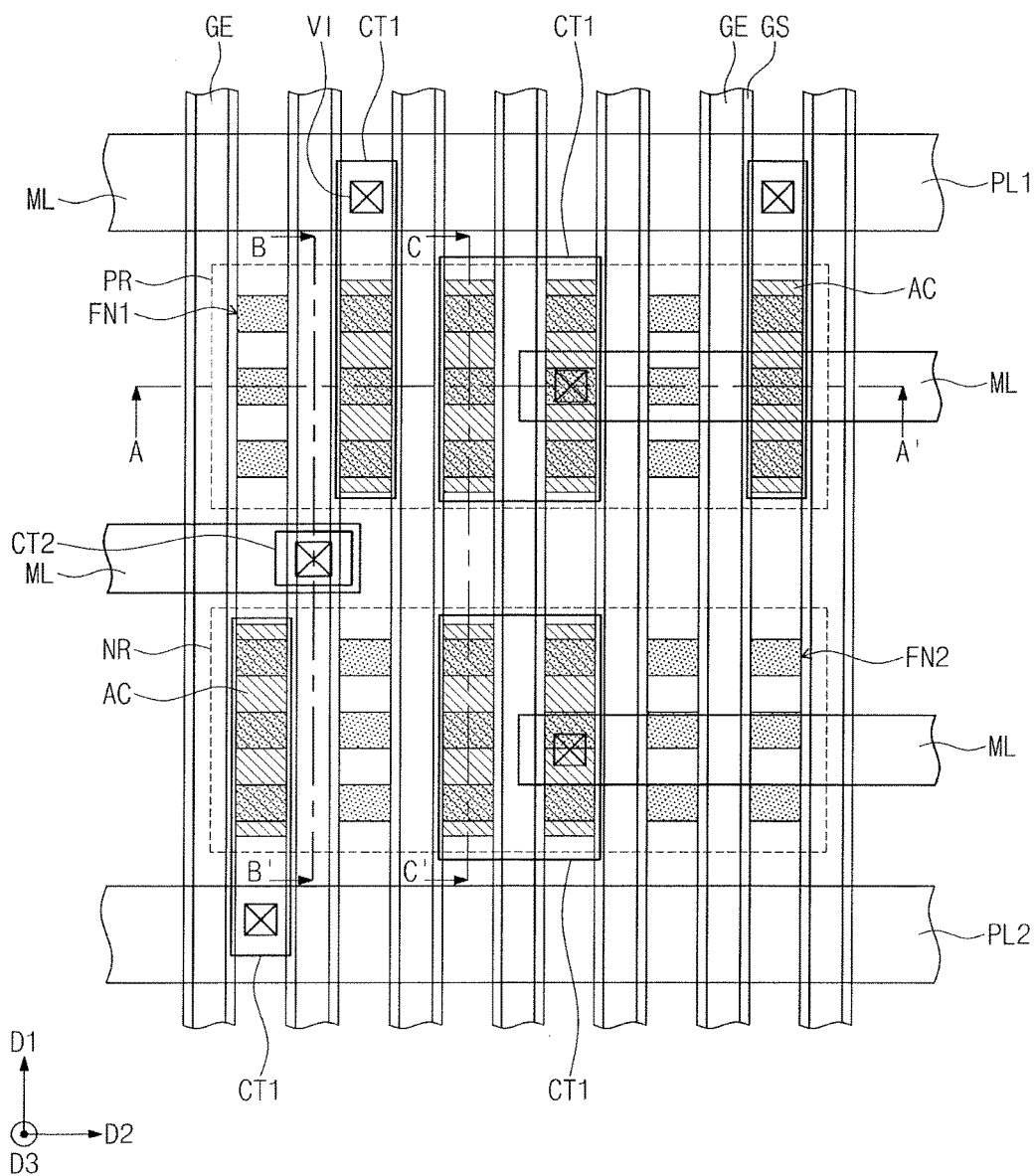
FIG. 1 illustrates a plan view of a semiconductor device according to exemplary embodiments.
Figure 2A:
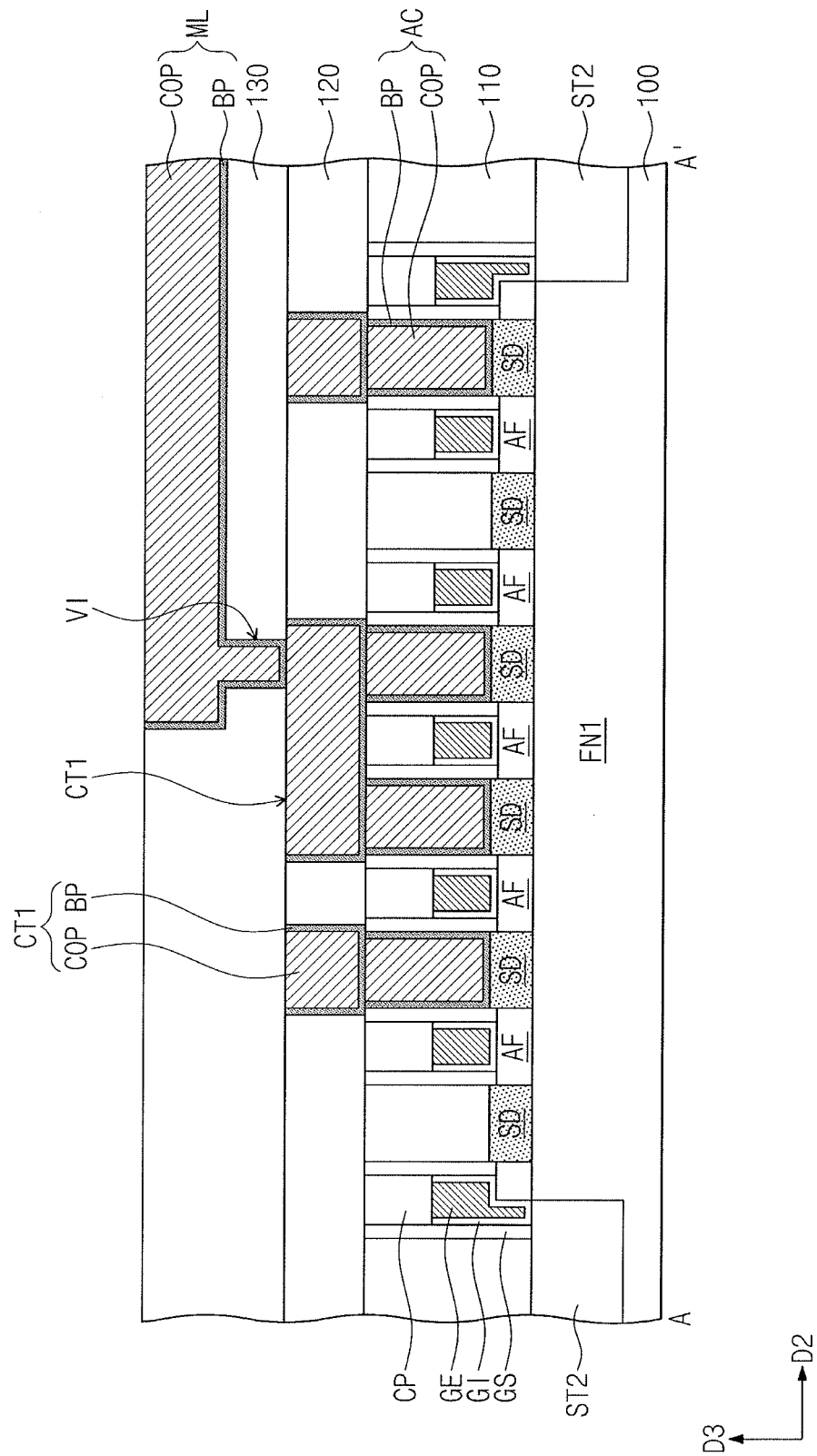
FIGS. 2A to 2C illustrate cross-sectional views along lines A-A', B-B', and C-C' of FIG. 1, respectively.
Figure 2B:
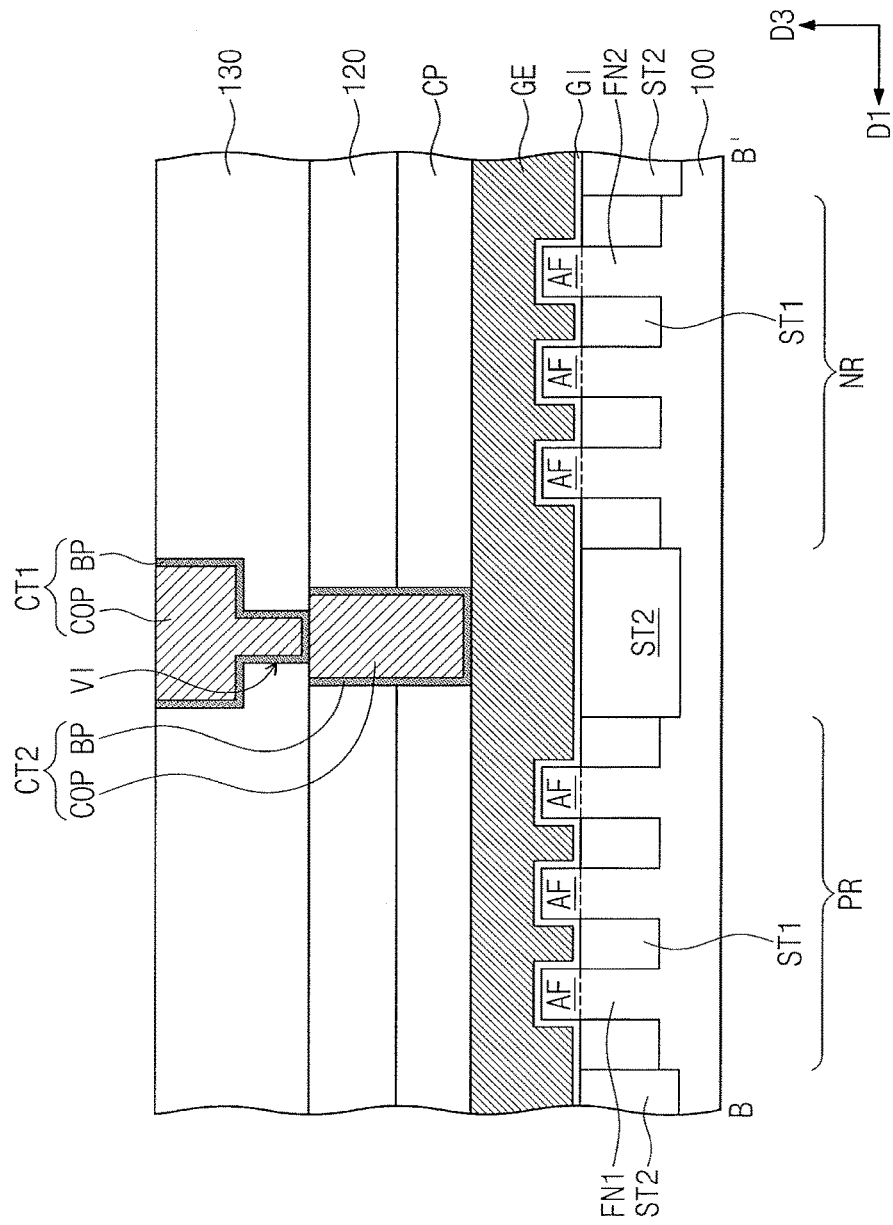
Figure 2C:
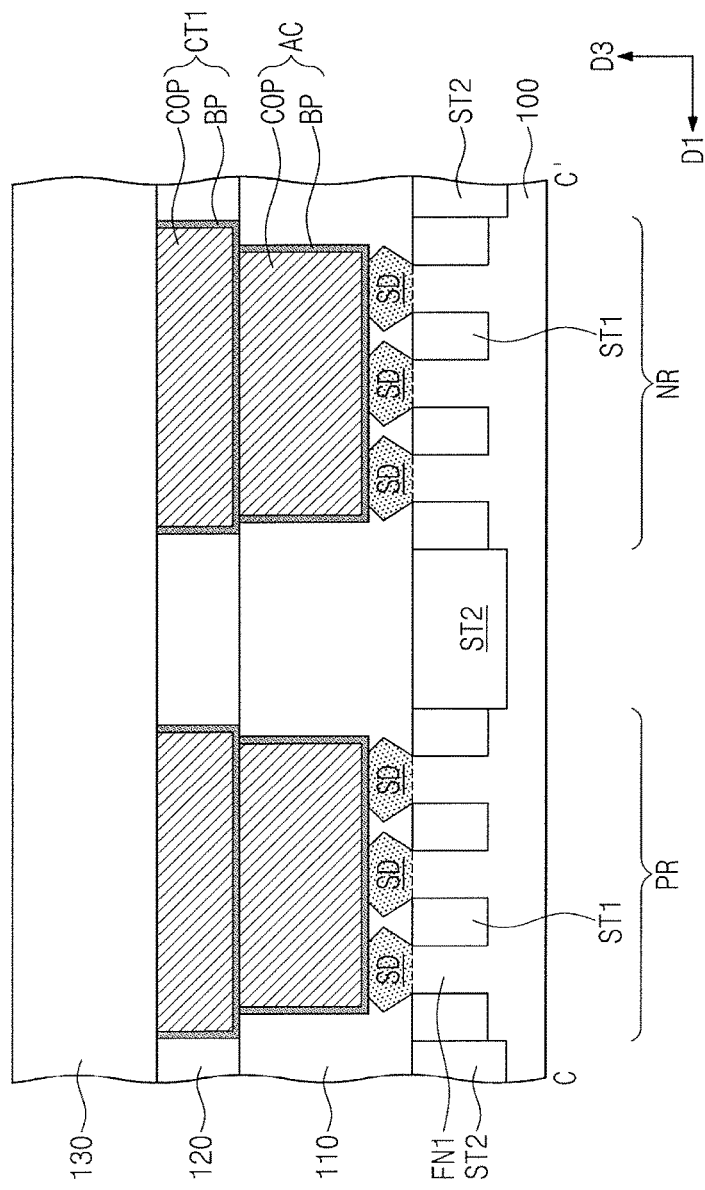

FIG. 1 is a plan view of a semiconductor device according to exemplary embodiments. FIGS. 2A to 2C are cross-sectional views taken along lines A-A', B-B', and C-C' of FIG. 1, respectively.

Referring to FIGS. 1 and 2A to 2C, a substrate 100 may be provided with a second device isolation layer ST2 at its upper portion, such that the second device isolation layer ST2 may define a PMOSFET region PR and an NMOSFET region NR. The PMOSFET region PR and the NMOSFET region NR may be spaced apart from each other across the second device isolation layer ST2 in a first direction D1 parallel to a top surface of the substrate 100. The PMOSFET region PR and the NMOSFET region NR may extend in a second direction D2 crossing the first direction D1. The substrate 100 may be a compound semiconductor substrate or a semiconductor substrate including, e.g., silicon, germanium, silicon-germanium, etc.

The PMOSFET and NMOSFET regions PR and NR may constitute a memory cell region for storing data. For example, the memory cell region of the substrate 100 may be provided thereon with memory cell transistors constituting a plurality of static random access memory (SRAM) cells. The PMOSFET and NMOSFET regions PR and NR may include at least one of the memory cell transistors.

Alternatively, the PMOSFET and NMOSFET regions PR and NR may be a logic cell region including thereon logic transistors that constitutes a logic circuit of a semiconductor device. For example, the logic cell region of the substrate 100 may be provided thereon with logic transistors constituting a processor core or an I/O terminal. The PMOSFET and NMOSFET regions PR and NR may include at least one of the logic transistors. Embodiments, however, are not limited thereto.

The PMOSFET region PR may be provided thereon with a plurality of first active patterns FN1 extending in the second direction D2. The NMOSFET region NR may be provided thereon with a plurality of second active patterns FN2 extending in the second direction D2. The first and second active patterns FN1 and FN2 may be portions of the substrate 100 that protrude from the top surface of the substrate 100. The first and second active patterns FN1 and FN2 may be arranged along the first direction D1. Each of the first and second active patterns FN1 and FN2 may be provided on its opposite sides with first device isolation layers ST1 extending in the second direction D2.

The first and second active patterns FN1 and FN2 may have upper portions that vertically protrude relative to, e.g., above, the first device isolation layers ST1. Each of the upper portions of the first and second active patterns FN1 and FN2 may be shaped like a fin protruding between a pair of the first device isolation layers ST1.

The first and second device isolation layers ST1 and ST2 may be substantially connected to constitute a single insulation layer. The second device isolation layer ST2 may have a thickness greater than that of the first device isolation layers ST1. In this case, the first device isolation layers ST1 may be formed separately from the second device isolation layer ST2. For example, the first and second device isolation layers ST1 and ST2 may include a silicon oxide layer.

Channel regions AF and source/drain regions SD may be provided at each of the upper portions of the first and second active patterns FN1 and FN2. The source/drain regions SD of the first active patterns FN1 may be p-type impurity regions. The source/drain regions SD of the second active patterns FN2 may be n-type impurity regions. Each of the channel regions AF may be interposed between a pair of the source/drain regions SD.

The source/drain regions SD may be epitaxial patterns formed by a selective epitaxial growth process. The source/drain regions SD may have top surfaces positioned higher than those of the channel regions AF. The source/drain regions SD may include a semiconductor element different from that of the substrate 100. For example, the source/drain regions SD of the first active patterns FN1 may include a semiconductor element whose lattice constant is greater than that of a semiconductor element included in the substrate 100. As a result, the source/drain regions SD of the first active pattern FN1 may provide the channel regions AF with a compressive stress. For example, the source/drain regions SD of the second active patterns FN2 may include a semiconductor element whose lattice constant is equal to or smaller than that of a semiconductor element included in the substrate 100. As a result, the source/drain regions SD of the second active pattern FN2 may provide the channel regions AF with a tensile stress.

Gate electrodes GE may be provided to extend in the first direction D1 while running across the first and second active patterns FN1 and FN2. The gate electrodes GE may be spaced apart from each other in the second direction D2. The gate electrodes GE may vertically overlap the channel regions AF. Each of the gate electrodes GE may surround a top surface and opposite sidewalls of each of the channel regions AF (see FIG. 2B). For example, the gate electrodes GE may include one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each of the gate electrodes GE. The gate spacers GS may extend in the first direction D1 along the gate electrodes GE. The gate spacers GS may have top surfaces higher than those of the gate electrodes GE. The top surfaces of the gate spacers GS may be coplanar with those of a capping pattern CP and a first interlayer dielectric layer 110 which will be discussed below. The gate spacers GS may include one or more of SiCN, SiCON, and SiN. Alternatively, the gate spacers GS may include a multiple layer consisting of two or more of SiCN, SiCON, and SiN.

Gate dielectric patterns GI may be interposed between the gate electrodes GE and the first active patterns FN1 and between the gate electrodes GE and the second active patterns FN2. Each of the gate dielectric patterns GI may extend along a bottom surface of each of the gate electrodes GE. Each of the gate dielectric patterns GI may cover the top surface and the opposite sidewalls of each of the channel regions AF. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A capping pattern CP may be provided on each of the gate electrodes GE. The capping patterns CP may extend in the first direction D1 along the gate electrodes GE. The capping patterns CP may include a material having an etch selectivity to first, second, and third interlayer dielectric layers 110, 120, and 130 which will be discussed below. In detail, the capping patterns CP may include one or more of SiON, SiCN, SiCON, and SiN. A single gate structure may be constituted by the gate electrode GE, the gate dielectric pattern GI, a pair of the gate spacers GS, and the capping pattern CP.

A first interlayer dielectric layer 110 may be provided on the substrate 100. The first interlayer dielectric layer 110 may cover the gate spacers GS and the source/drain regions SD. The first interlayer dielectric layer 110 may have a top surface substantially coplanar with top surfaces of the capping patterns CP and the top surfaces of the gate spacers GS.

A pair of the gate electrodes GE may be provided therebetween with an active contact AC that penetrates the first interlayer dielectric layer 110 and is electrically connected to the source/drain regions SD. Adjacent active contacts AC may be spaced apart from each other in the second direction D2 across the gate electrode GE. For example, each of the active contacts AC may be connected to a plurality of the source drain regions SD. Alternatively, at least one active contact AC may be connected to a single source/drain region SD, but not especially limited thereto.

Each of the active contacts AC may be in direct contact with the gate spacers GS on its opposite sides. Each of the active contacts AC may have a width in the second direction D2, and the width may be substantially the same as a distance between the gate spacers GS that are adjacent to each other across the source/drain region SD. The active contacts AC may have top surfaces coplanar with that of the first interlayer dielectric layer 110.

Each of the active contacts AC may include a conductive pattern COP and a barrier pattern BP surrounding the conductive pattern COP. The barrier pattern BP may cover sidewalls and a bottom surface of the conductive pattern COP. The barrier pattern BP may not cover a top surface of the conductive pattern COP. The conductive pattern COP may include a metallic material, for example, cobalt, tungsten, or copper. The barrier pattern BP may include metal nitride, for example, Ti/TiN.

In some embodiments, the active contacts AC may be self-aligned contacts that are self-alignedly formed. The capping pattern CP and the gate spacers GS may be utilized to selectively form the self-aligned active contact AC in a space between the gate spacers GS.

Silicide layers may be interposed between the source/drain regions SD and the active contacts AC. That is, the active contacts AC may be electrically connected through the silicide layers to the source/drain regions SD. The silicide layers may include, e.g., metal silicide, for example, one or more of titanium silicide, tantalum silicide, and tungsten silicide.

The first interlayer dielectric layer 110 may be provided thereon with a second interlayer dielectric layer 120 covering the capping patterns CP and the active contacts AC. First contacts CT1 and a second contact CT2 may be disposed in the second interlayer dielectric layer 120. The first contacts CT1 may be connected to the active contacts AC, and the second contact CT2 may be connected to the gate electrode GE. For example, at least one first contact CT1 may be connected to one active contact AC. Alternatively, at least one first contact CT1 may be connected to a plurality of the active contacts AC adjacent to each other, but not especially limited thereto. The gate electrode GE may be in contact with the second contact CT2 that penetrates the second interlayer dielectric layer 120 and the capping pattern CP. The first and second contacts CT1 and CT2 may have top surfaces substantially coplanar with that of the second interlayer dielectric layer 120.

Each of the first and second contacts CT1 and CT2 may include a conductive pattern COP and a barrier pattern BP surrounding the conductive pattern COP. A detailed description about the conductive patterns COP and the barrier patterns BP of the first and second contacts CT1 and CT2 may be similar to the aforementioned description about the conductive patterns COP and the barrier patterns BP of the active contacts AC.

The second interlayer dielectric layer 120 may be provided thereon with a third interlayer dielectric layer 130 covering the first and second contacts CT1 and CT2. The third interlayer dielectric layer 130 may be provided therein with a first power line PL1, a second power line PL2, and conductive lines ML. The first and second power lines PL1 and PL2 and the conductive lines ML may have top surfaces substantially coplanar with that of the third interlayer dielectric layer 130.

The first power line PL1 may be disposed on the first contact CT1 and electrically connected through a via VI to the first contact CT1. The second power line PL2 may be disposed on the second contact CT2 and electrically connected through a via VI to the second contact CT2. Each of the conductive lines ML may be electrically connected through a via VI to one of the first and second contacts CT1 and CT2. For example, the first and second power lines PL1 and PL2 and the conductive lines ML may be integrally connected to corresponding vias VI.

Each of the first and second power lines PL1 and PL2 and the conductive lines ML may include a conductive pattern COP and a barrier pattern BP surrounding the conductive pattern COP. A detailed description about the conductive patterns COP and the barrier patterns BP of the first and second power lines PL1 and PL2 and the conductive lines ML may be similar to the aforementioned description about the conductive patterns COP and the barrier patterns BP of the active contacts AC.

FIGS. 3, 5, 7, 9, 11, 13, 15, 17, 19, and 21 are plan views for explaining a method of manufacturing a semiconductor device according to exemplary embodiments. FIGS. 4A, 6A, 8A, 10A, 12A, 14A, 16A, 18A, 20A, and 22A are cross-sectional views taken along line A-A' of FIGS. 3, 5, 7, 9, 11, 13, 15, 17, 19, and 21, respectively. FIGS. 4B, 6B, 8B, 10B, 12B, 14B, 16B, 18B, 20B, and 22B are cross-sectional views taken along line B-B' of FIGS. 3, 5, 7, 9, 11, 13, 15, 17, 19, and 21, respectively. FIGS. 6C, 8C, 10C, 12C, 14C, 16C, 18C, 20C, and 22C are cross-sectional views taken along line C-C' of FIGS. 5, 7, 9, 11, 13, 15, 17, 19, and 21, respectively.

Figure 3:
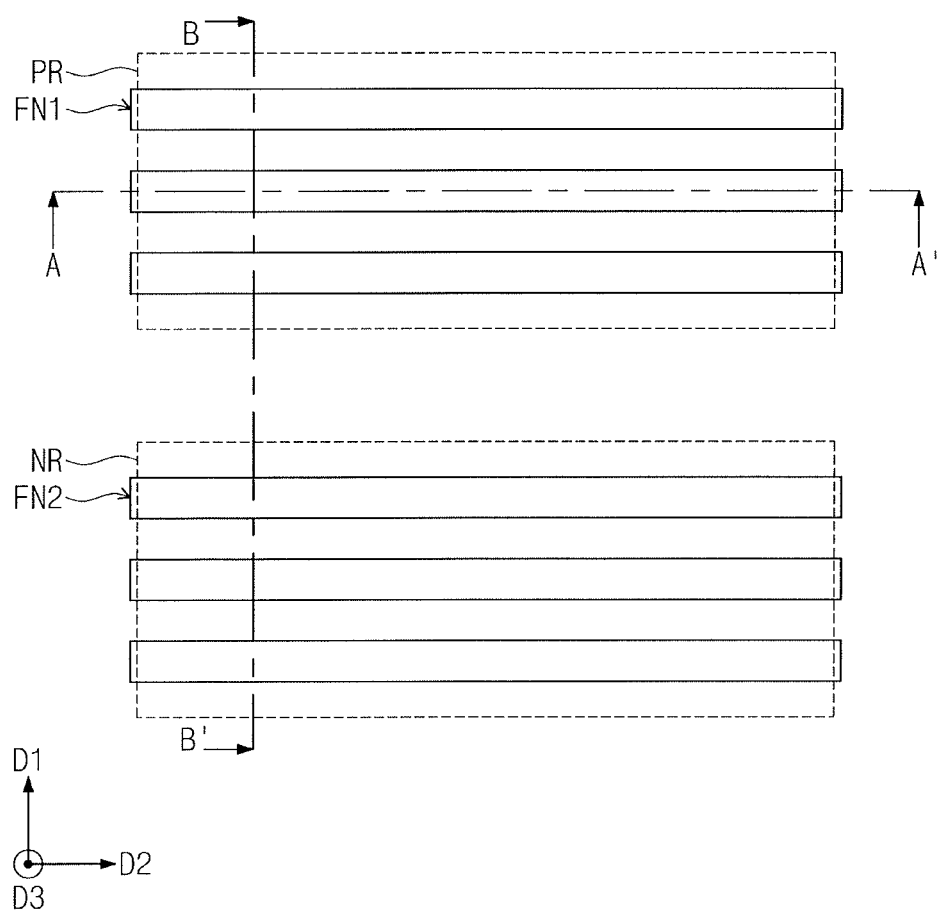
FIGS. 3, 5, 7, 9, 11, 13, 15, 17, 19, and 21 illustrate plan views of stages in a method of manufacturing a semiconductor device according to exemplary embodiments.
Figure 5:
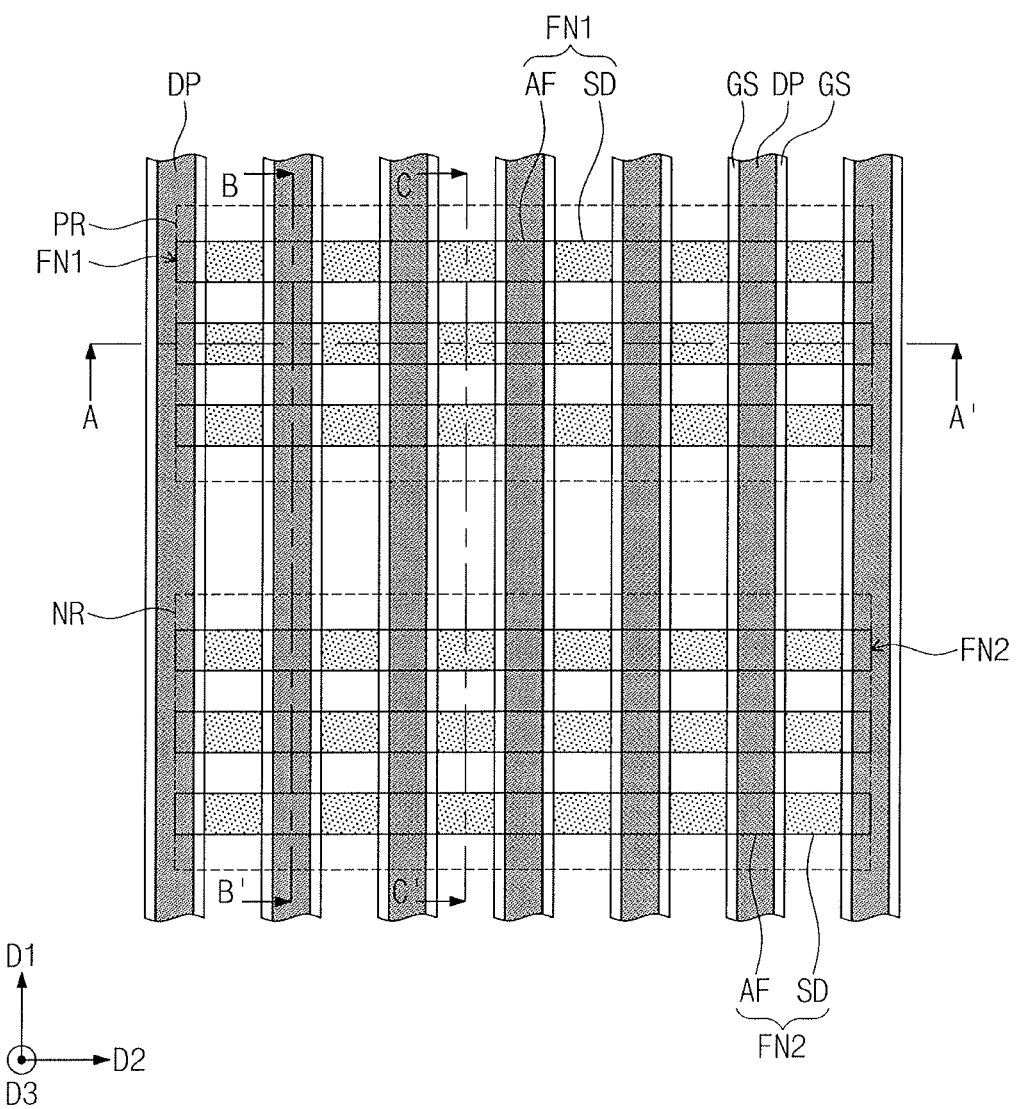

Referring to FIGS. 3, 4A, and 4B, a substrate 100 may be patterned to form active patterns FN1 and FN2. The substrate 100 may be a compound semiconductor substrate or a semiconductor substrate including, e.g., silicon, germanium, silicon-germanium, etc.

First device isolation layers ST1 may be formed on the substrate 100 to fill between the active patterns FN1 and FN2. The first device isolation layers ST1 may be recessed to expose upper portions of the active patterns FN1 and FN2. A second isolation layer ST2 may be formed on the substrate 100 to define a PMOSFET region PR and an NMOSFET region NR. For example, when the second device isolation layer ST2 is formed, active patterns may be removed from regions other than the PMOSFET and NMOSFET regions PR and NR. Active patterns remaining on the PMOSFET region PR may be referred to as first active patterns FN1, and active patterns remaining on the NMOSFET region NR may be referred to as second active patterns FN2.

An ST1 (Shallow Trench Isolation) process may be employed to form the first and second device isolation layers ST1 and ST2. Silicon oxide may be used to form the first and second device isolation layers ST1 and ST2. For example, the first device isolation layers ST1 may be formed to have a depth less than that of the second device isolation layer ST2. In this case, the first device isolation layers ST1 may be formed separately from the second device isolation layer ST2. Alternatively, the first device isolation layers ST1 may be formed to have a depth substantially the same as that of the second device isolation layer ST2. In this case, the first device isolation layers ST1 may be formed simultaneously with the second device isolation layer ST2.

Referring to FIGS. 5 and 6A to 6C, dummy patterns DP may be formed to run across the first and second active patterns FN1 and FN2. The dummy patterns DP may be formed to have a linear shape extending in a first direction D1. The formation of the dummy patterns DP may include forming a sacrificial layer on an entire surface of the substrate 100, forming mask patterns MP on the sacrificial layer, and patterning the sacrificial layer using the mask patterns MP as an etch mask. The sacrificial layer may include a polysilicon layer.

A pair of gate spacers GS may be formed on opposite sidewalls of each of the dummy patterns DP. The formation of the gate spacers GS may include conformally forming a spacer layer on the entire surface of the substrate 100 and anisotropically etching the spacer layer. The spacer layer may include one or more of, e.g., SiCN, SiCON, and SiN. Alternatively, the spacer layer may be a multiple layer including two or more of, e.g., SiCN, SiCON, and SiN.

Source/drain regions SD may be formed on opposite sides of each of the dummy patterns DP. The source/drain regions SD may be formed by a selective epitaxial growth process that uses the substrate 100 as a seed layer. For example, the selective epitaxial growth process may include chemical vapor deposition (CVD) or molecular beam epitaxy (MBE).

An etch process may be performed to selectively etch the first and second active patterns FN1 and FN2 on the opposite sides of each of the dummy patterns DP. Upper portions of the etched first and second active patterns FN1 and FN2 may serve as seed layers to form the source/drain regions SD. The formation of the source/drain regions SD may define a channel region AF between a pair of the source/drain regions SD.

The source/drain regions SD of the first active patterns FN1 may be doped with p-type impurities, and the source/drain region SD of the second active patterns FN2 may be doped with n-type impurities. For example, the impurities may be in-situ doped when the source/drain regions SD are formed. Alternatively, after the source/drain regions SD are formed, the impurities may be doped into the source/drain regions SD.

Figure 6A:
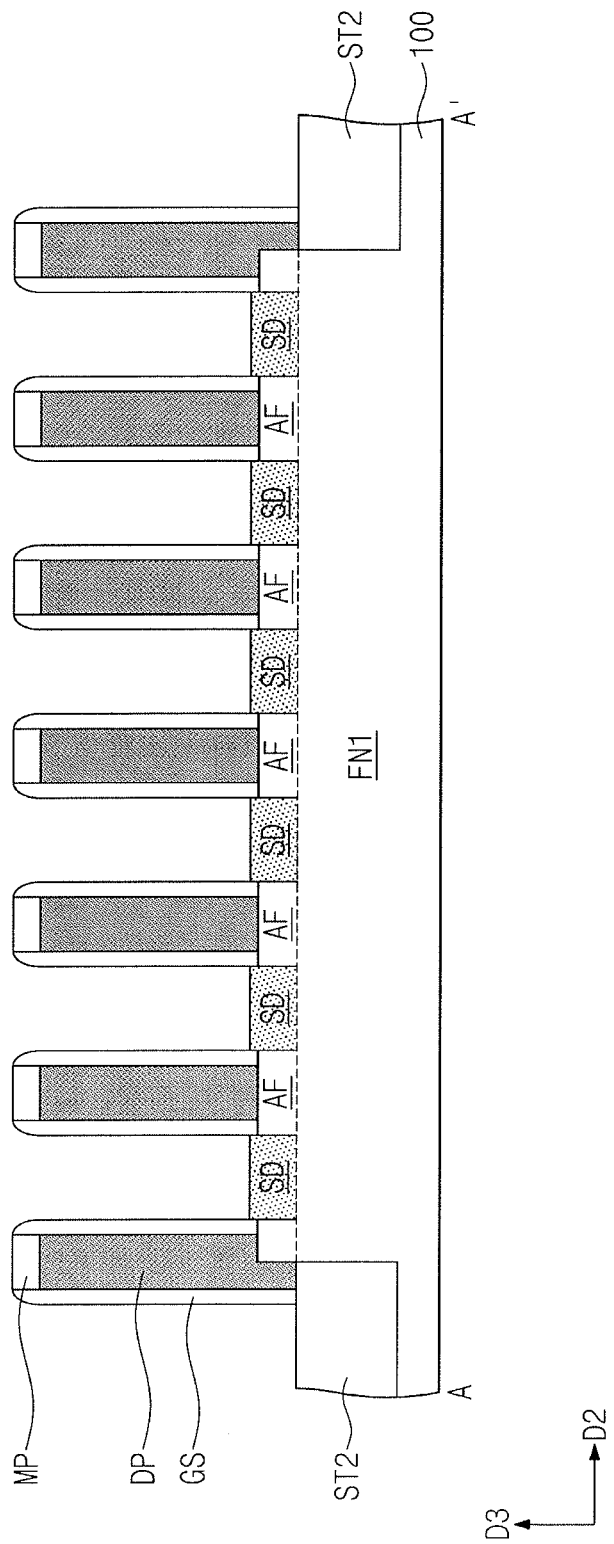
Figure 6B:
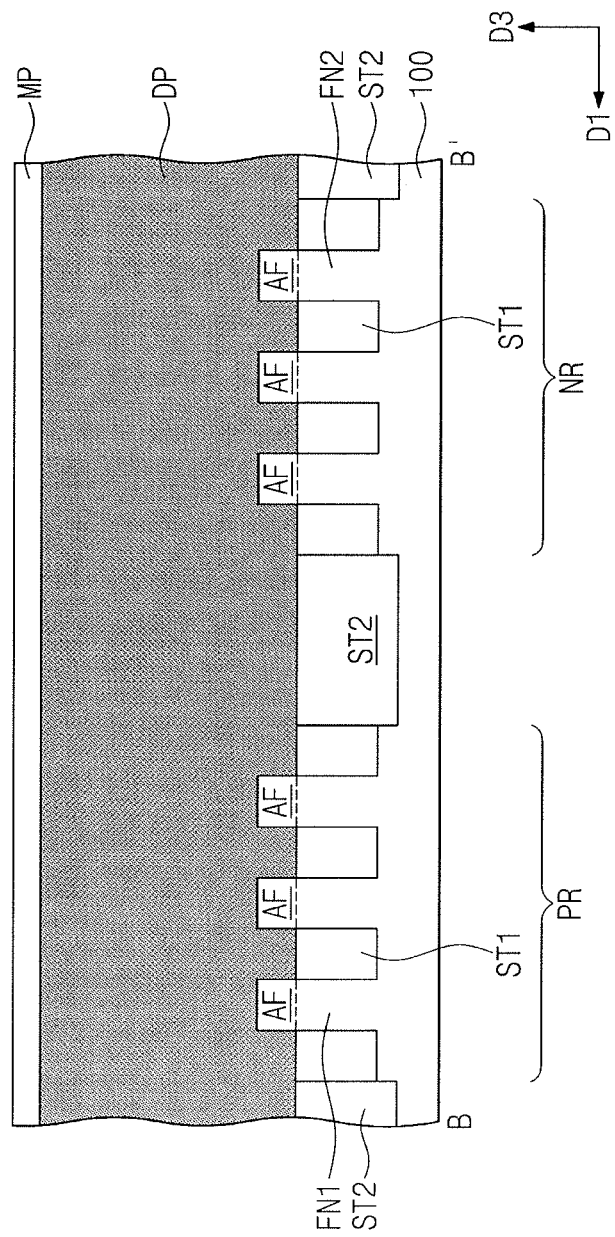
Figure 6C:
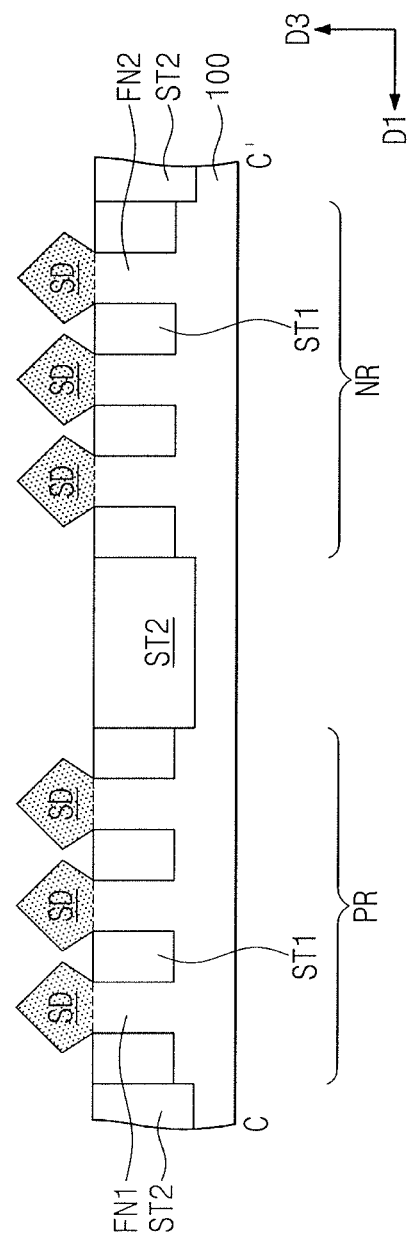
Figure 7:
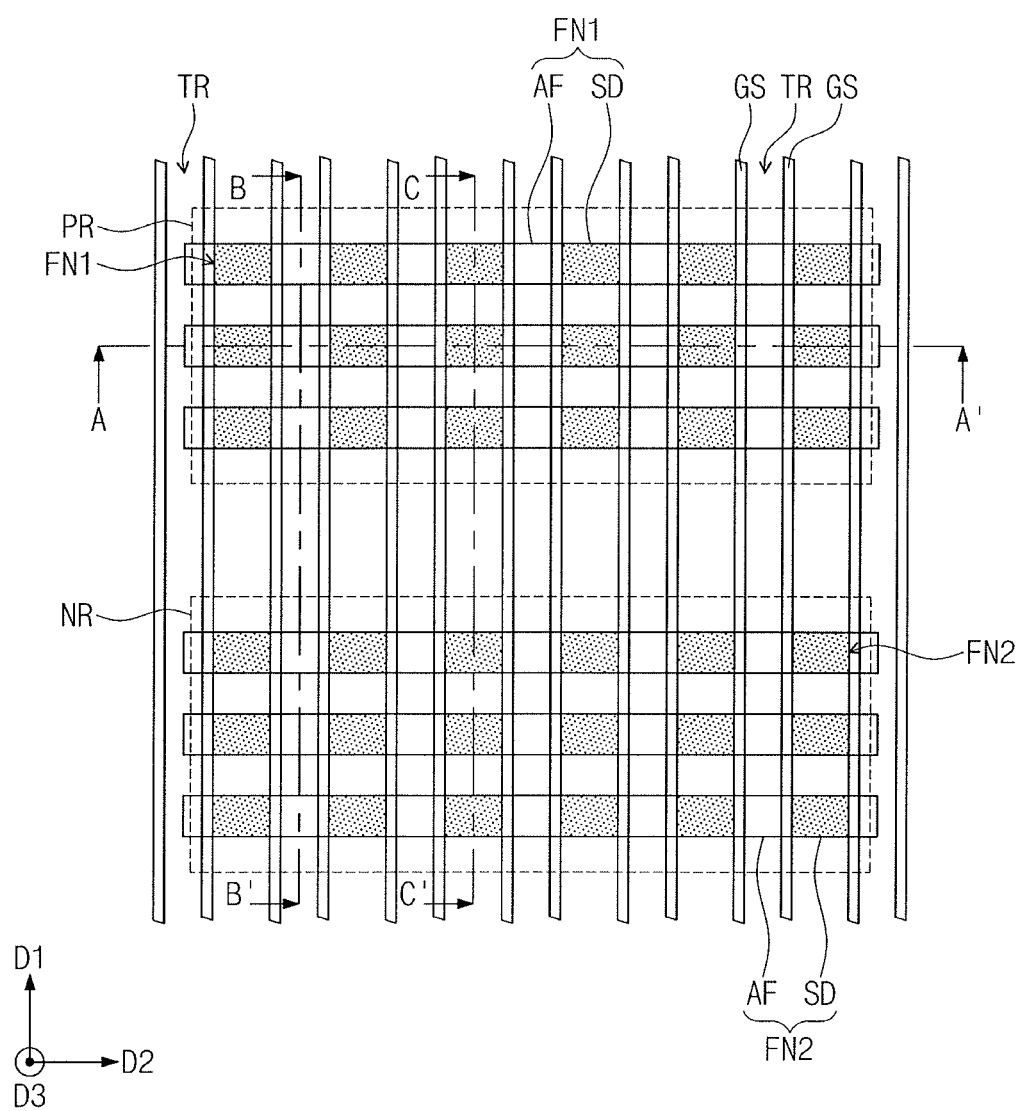
Figure 8B:
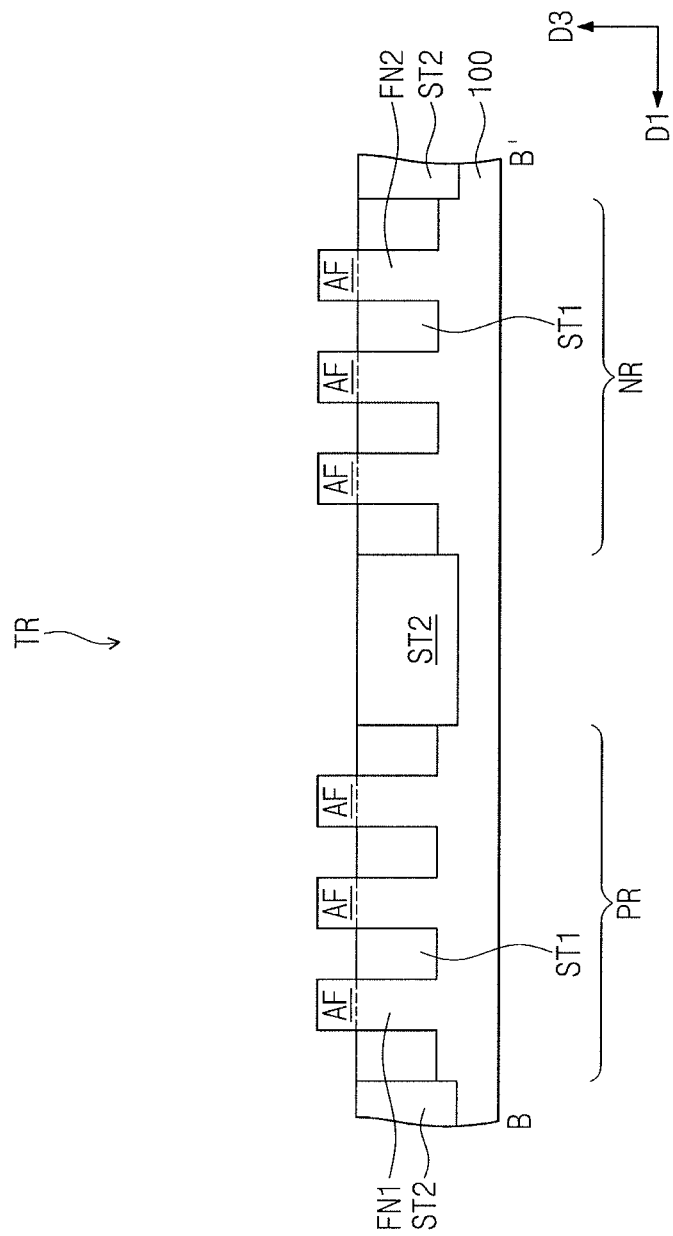
Figure 8C:
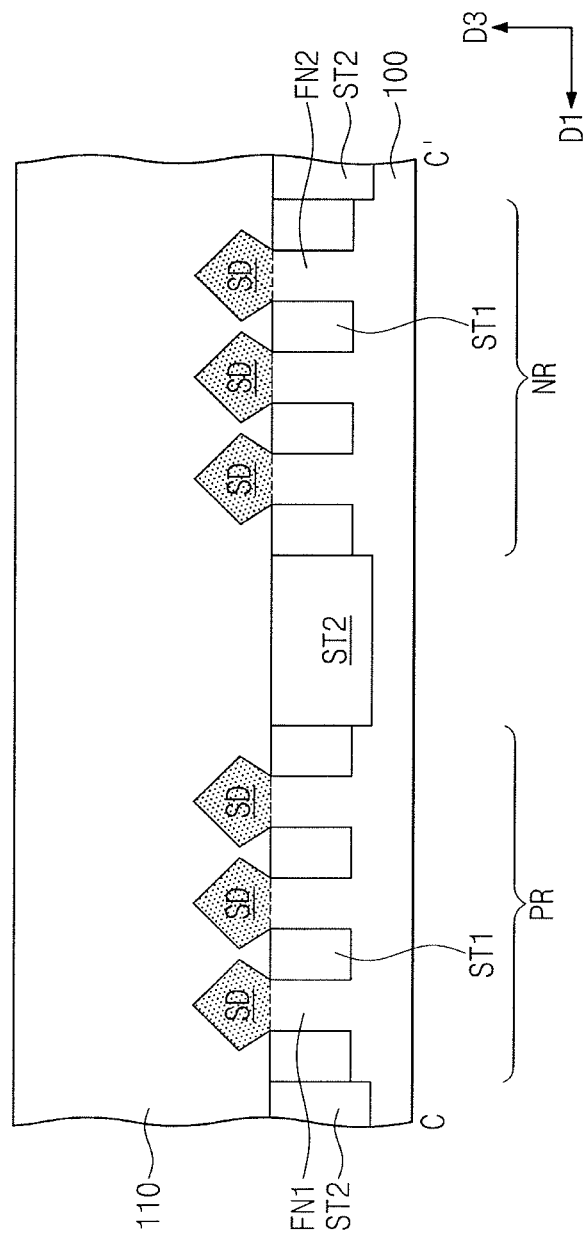
Figure 9:
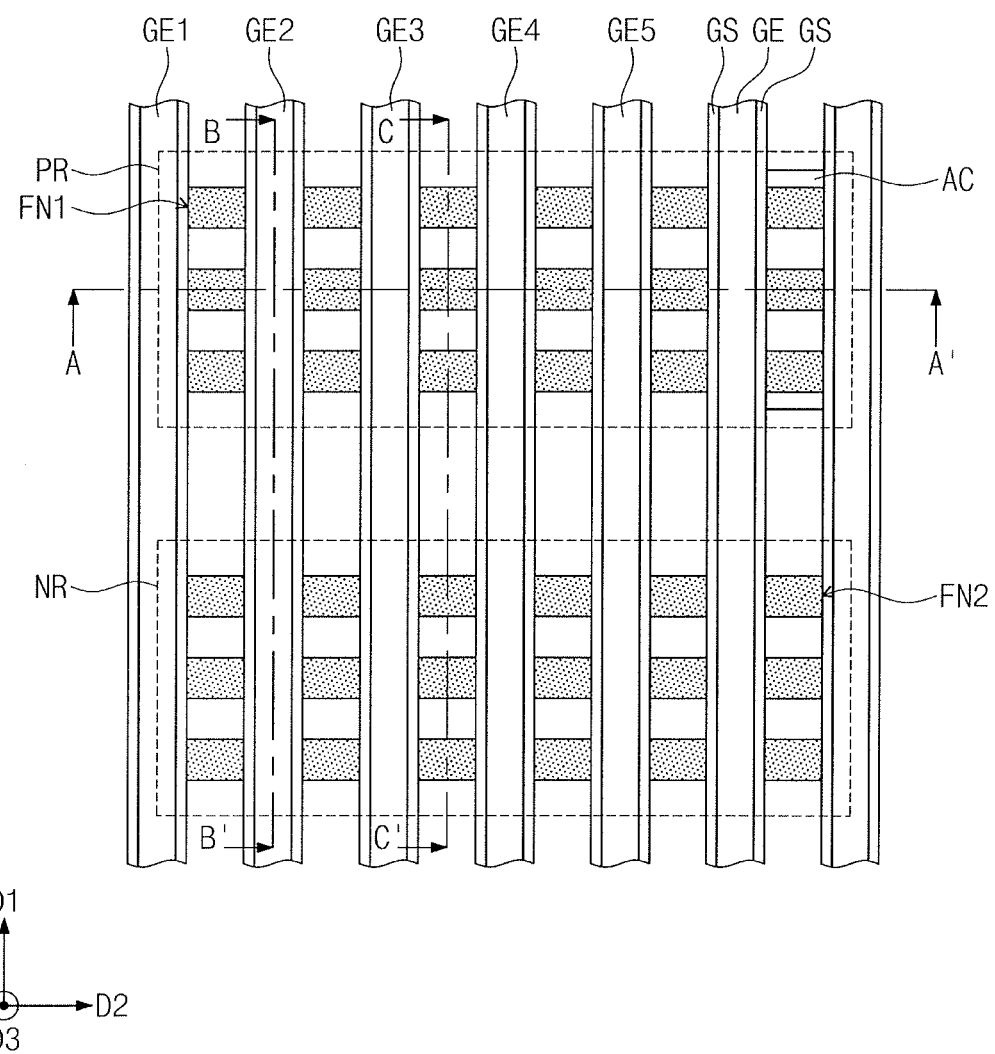
Figure 10B:
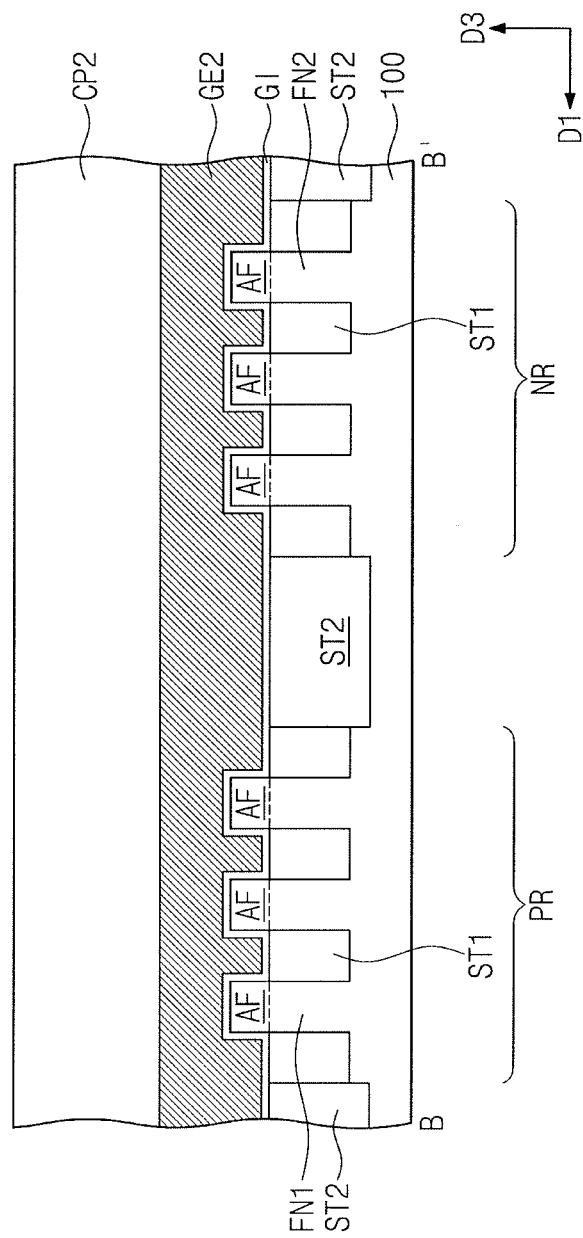
Figure 11:
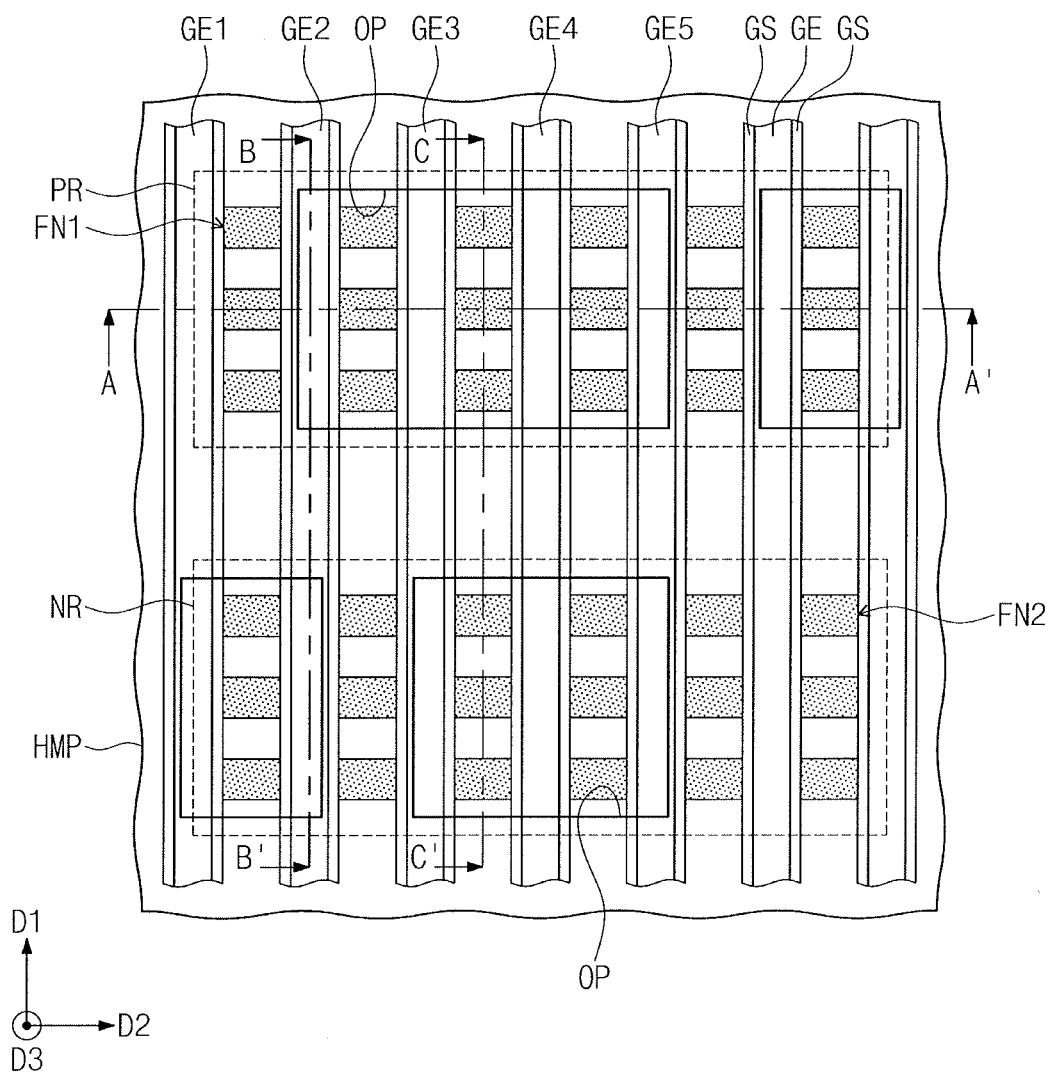
Figure 12A:
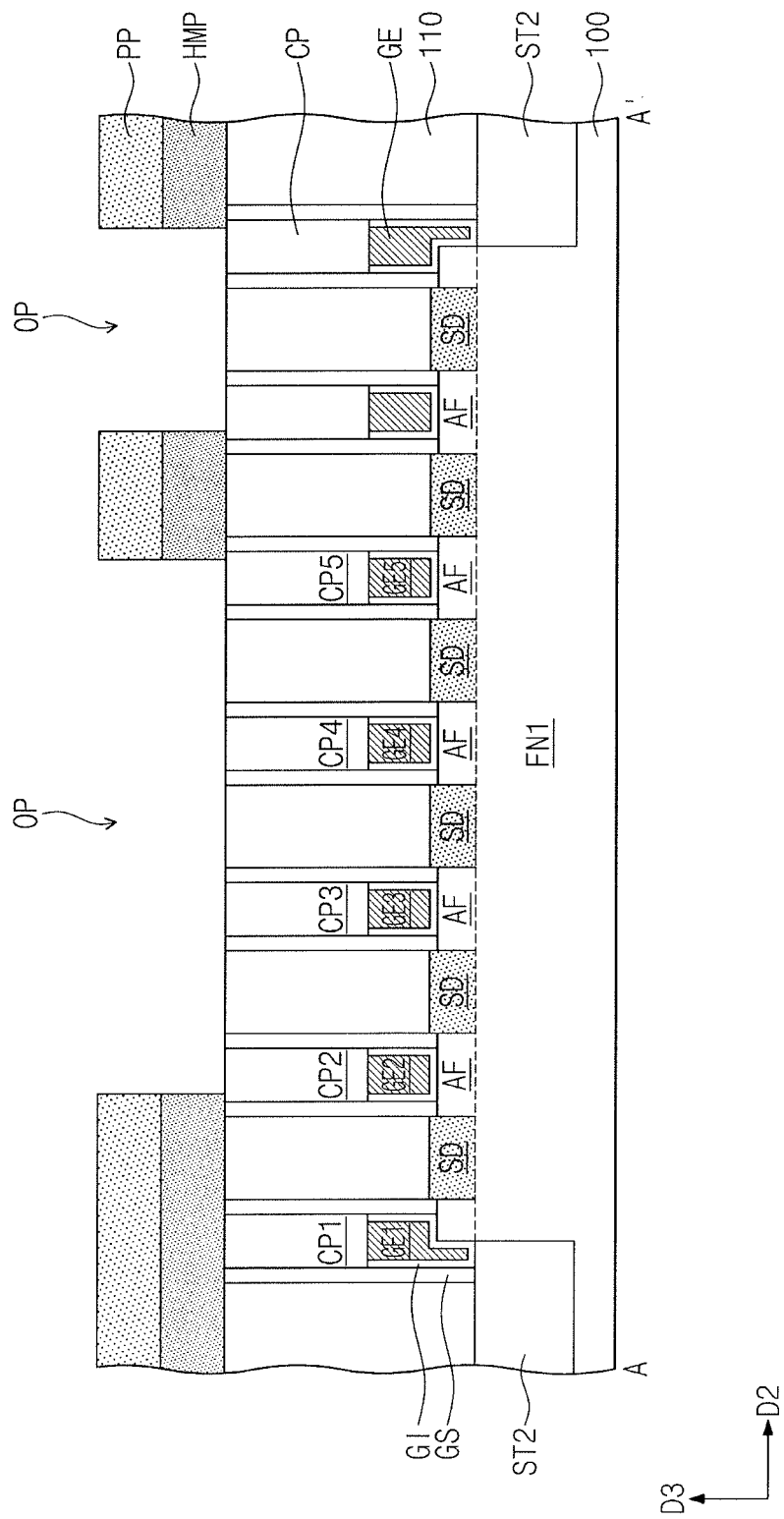
Figure 12B:
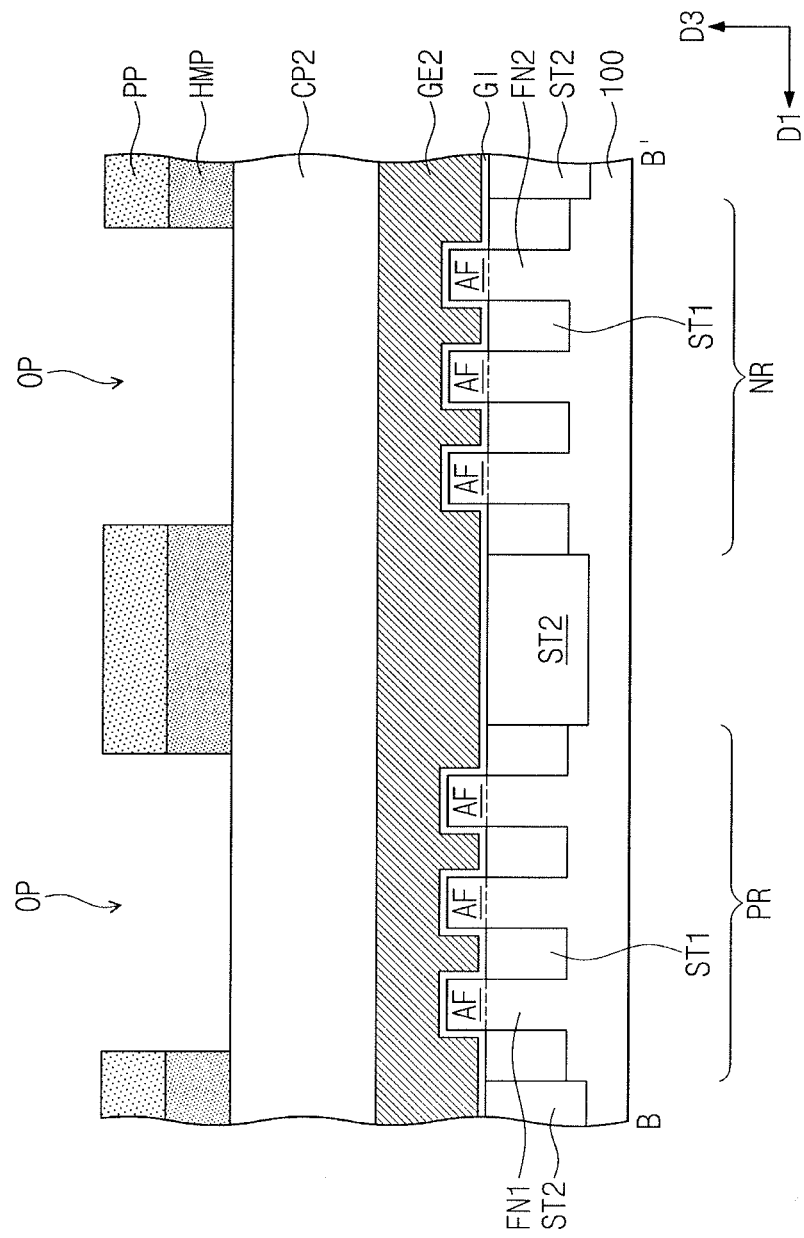
Figure 12C:
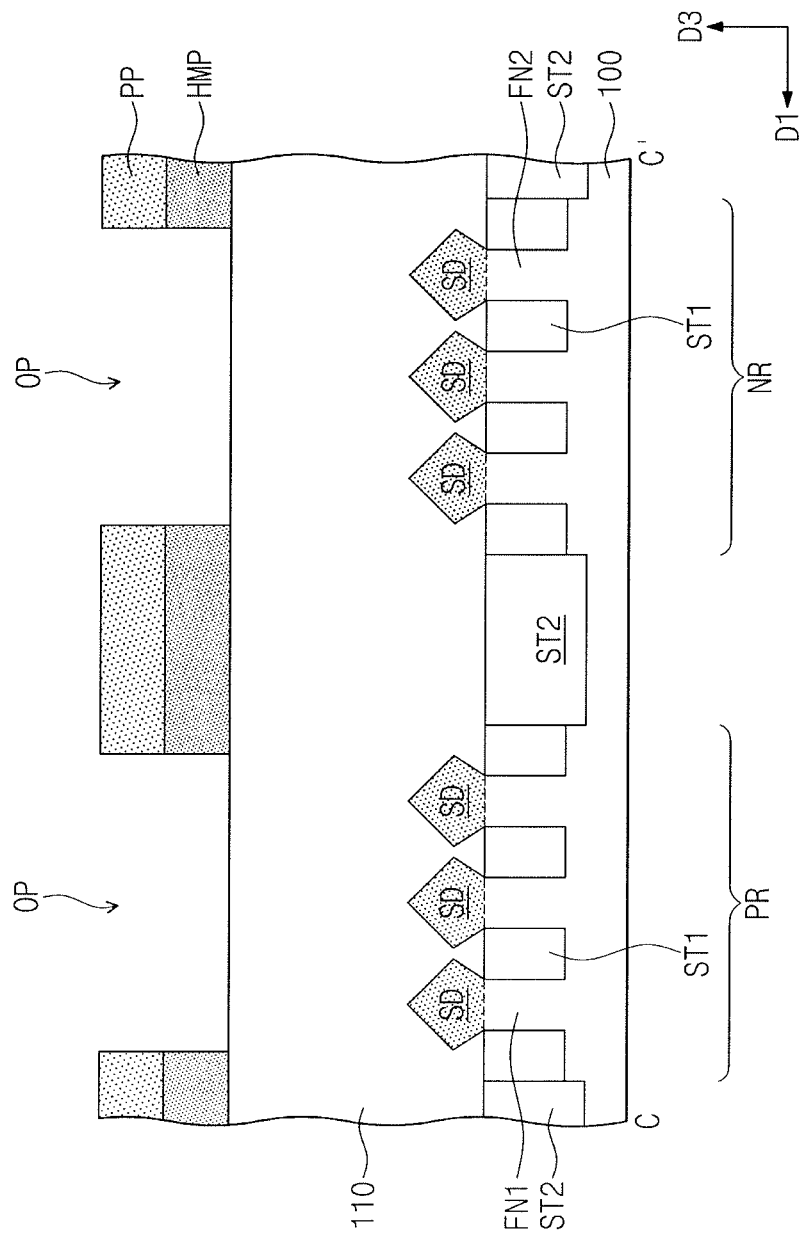
Figure 13:
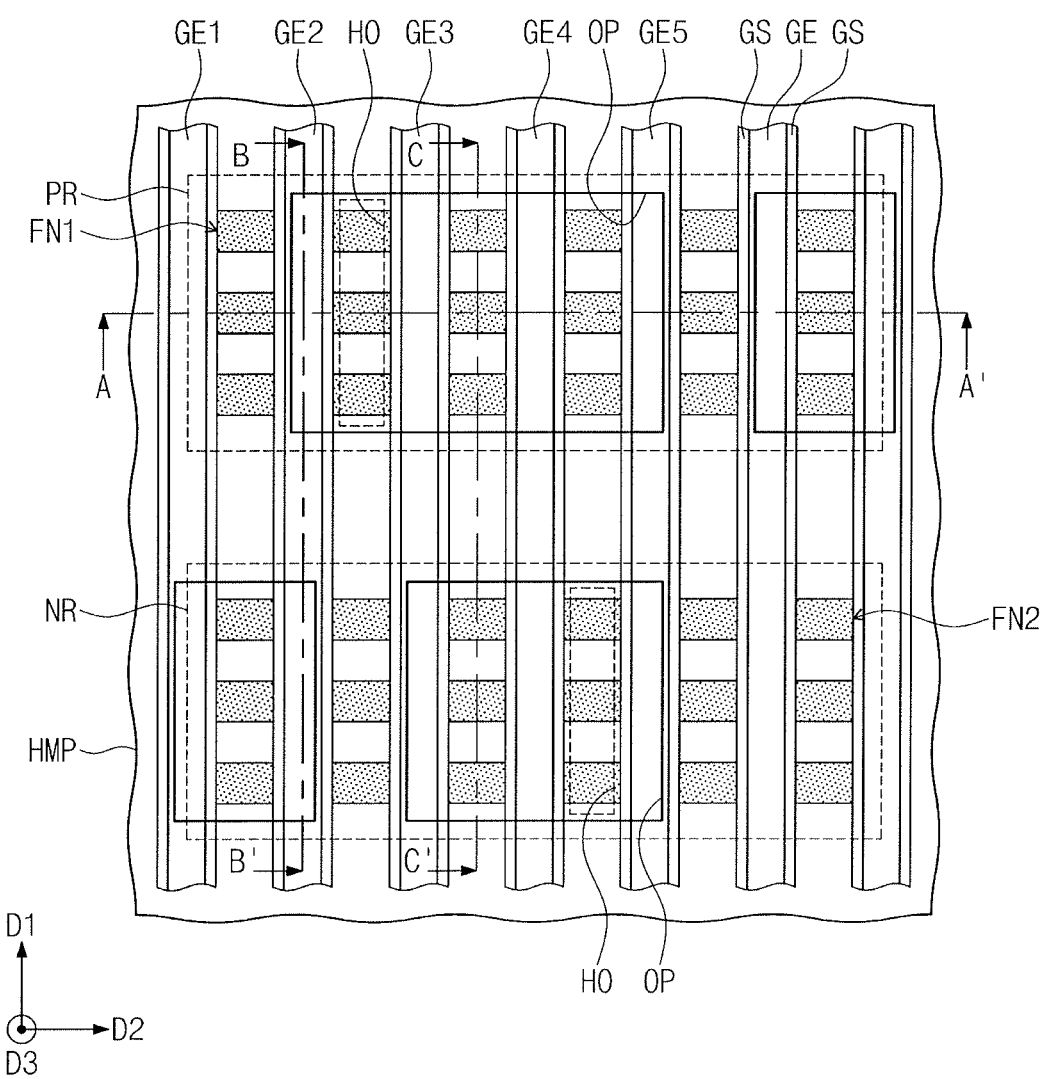
Figure 14A:
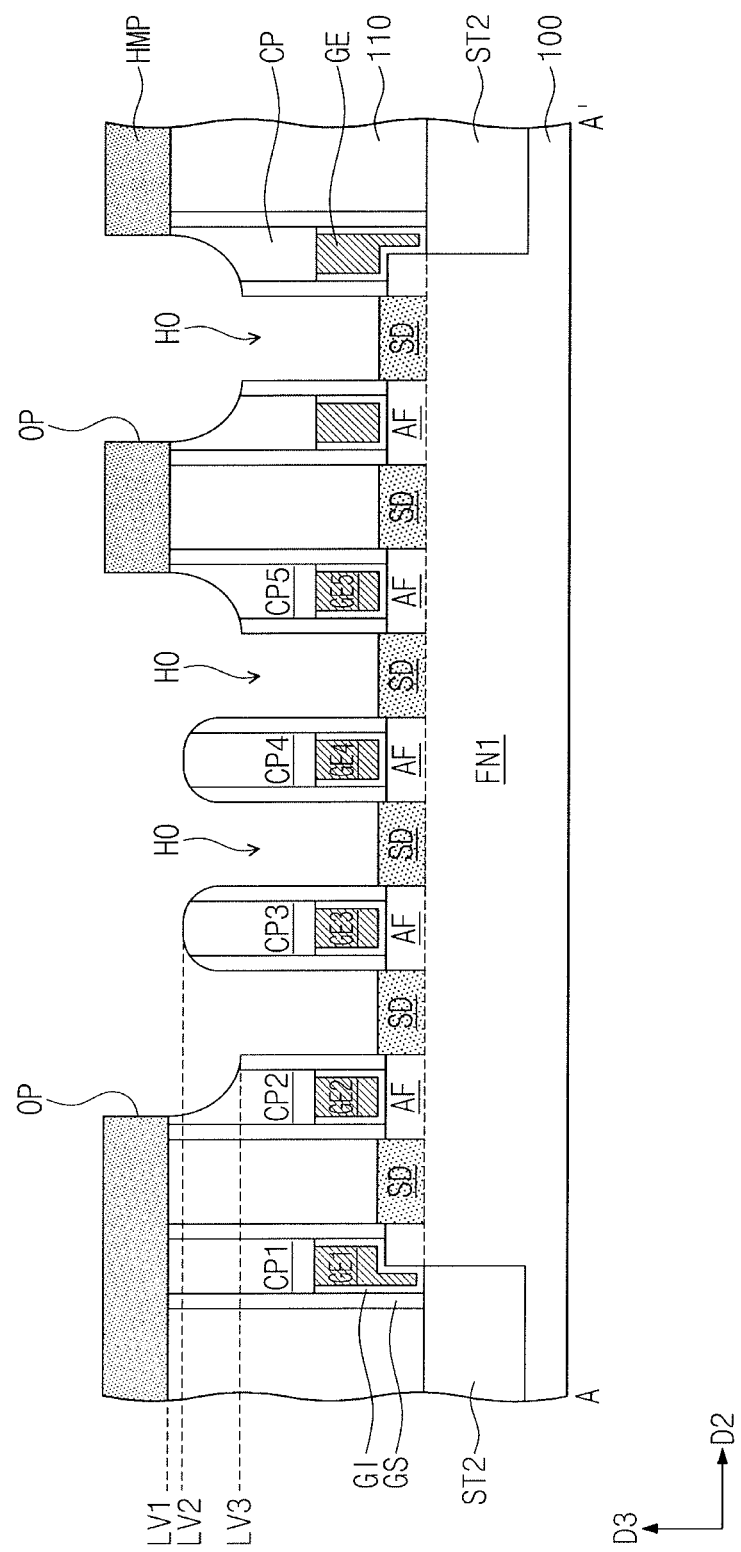
Figure 14B:
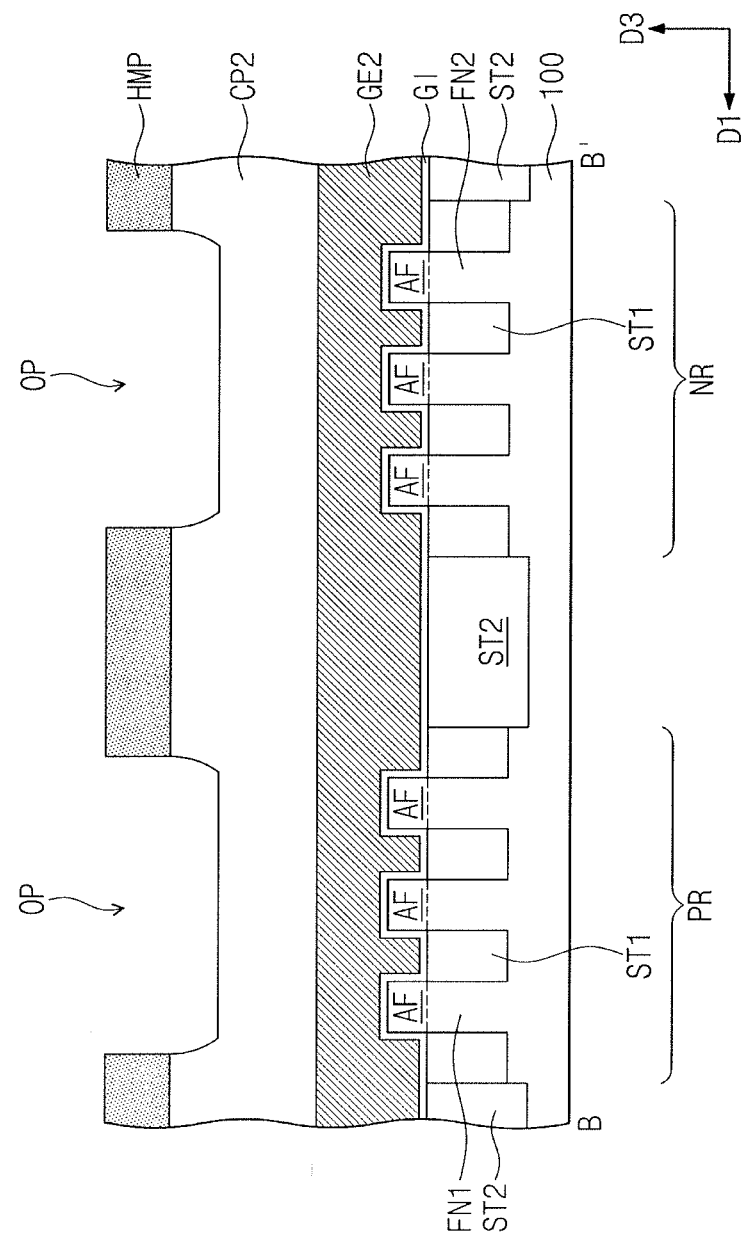
Figure 14C:
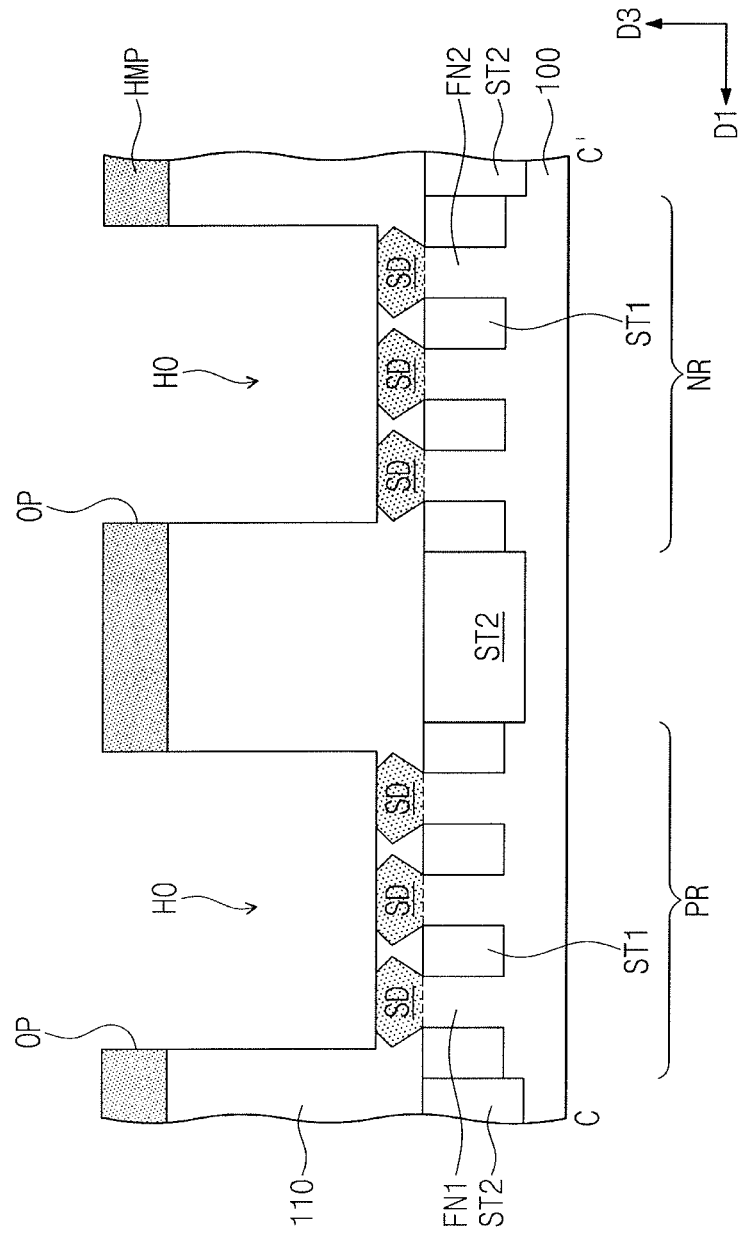
Figure 15:
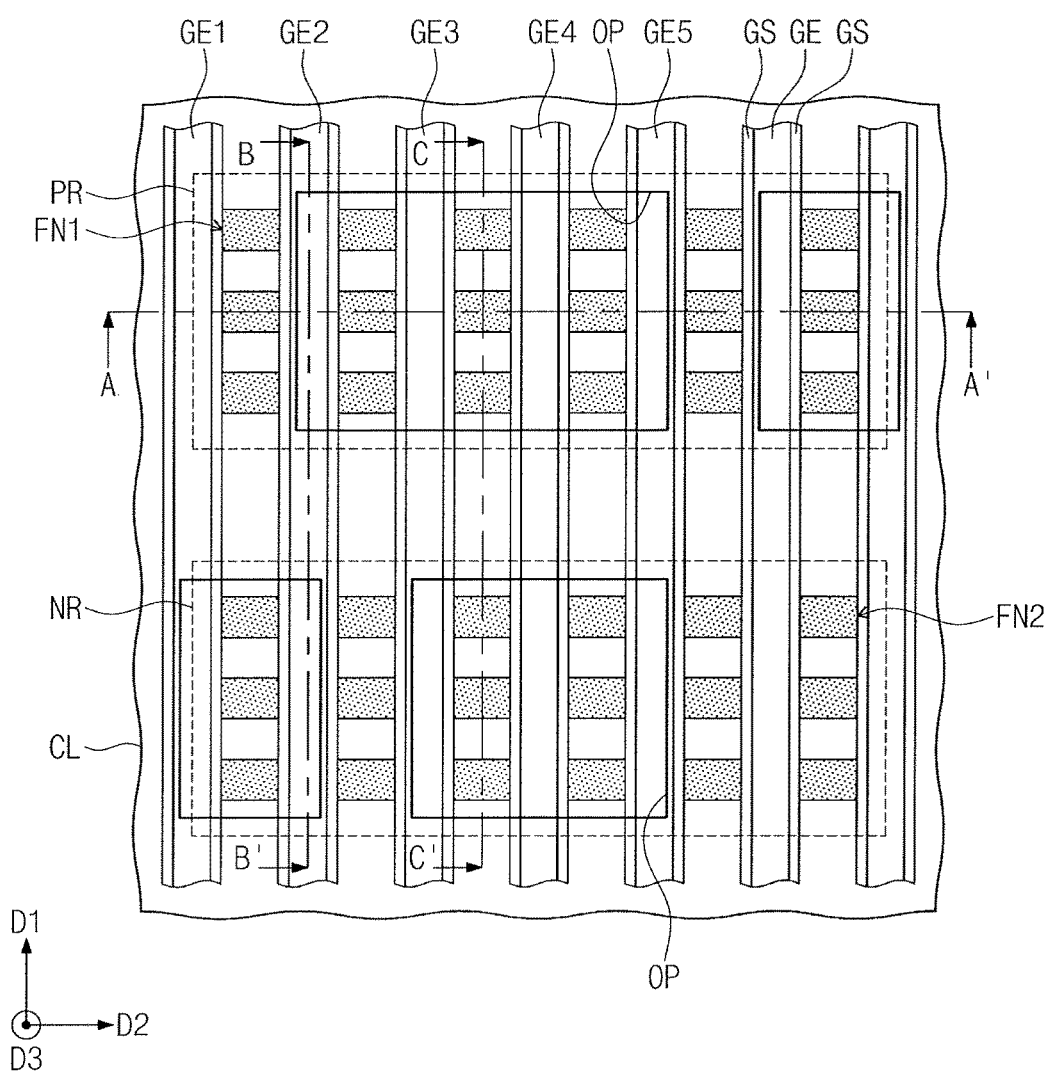
Figure 16A:
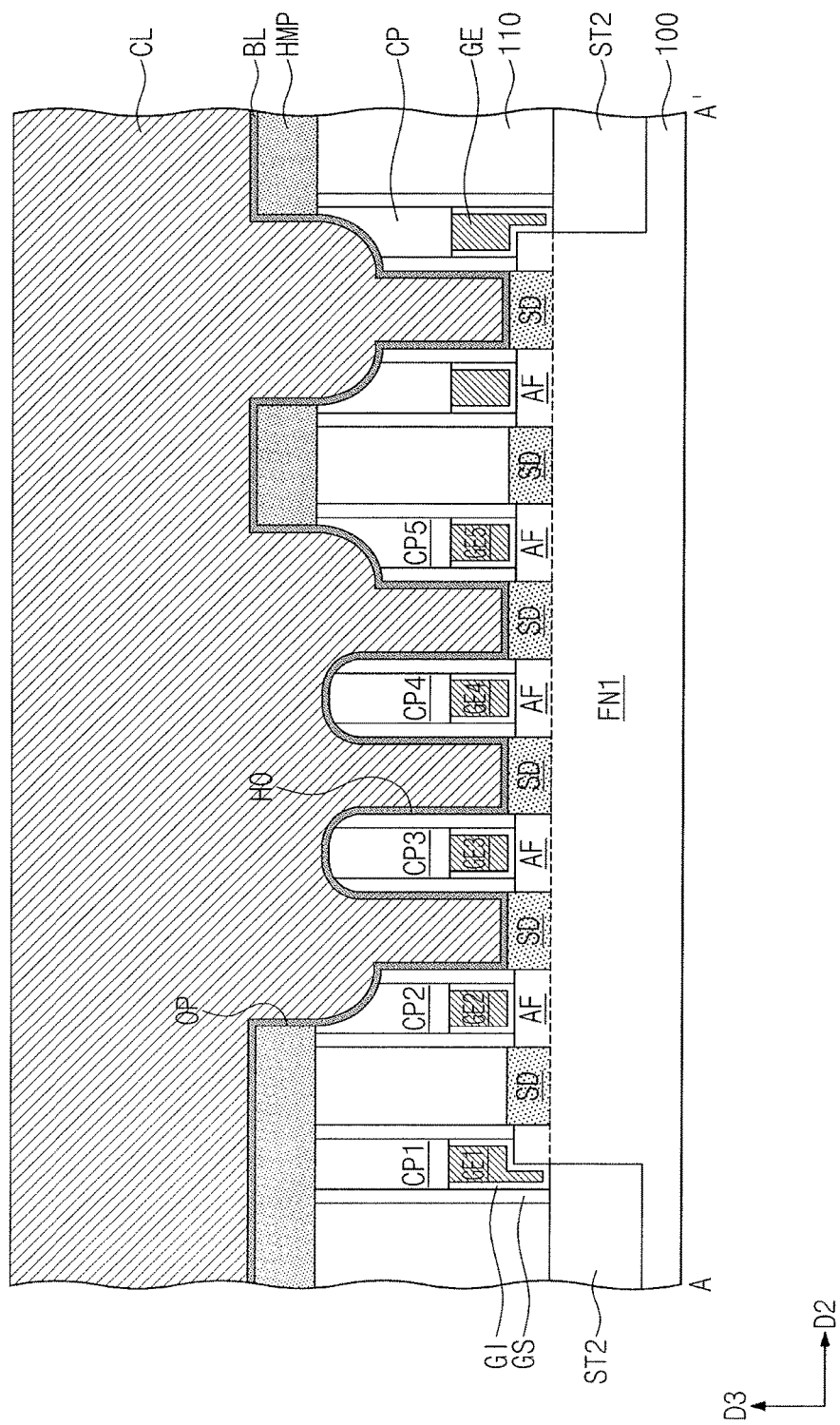
Figure 16B:
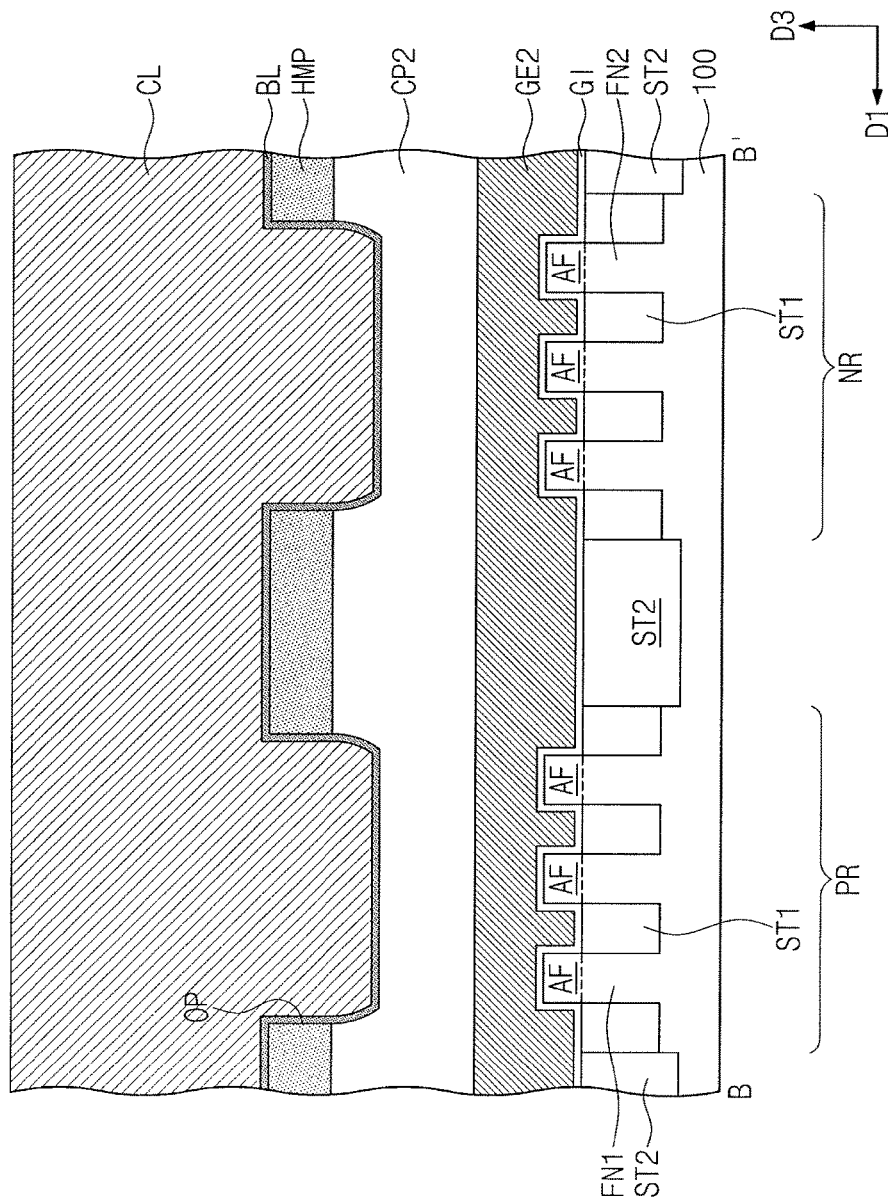
Figure 16C:
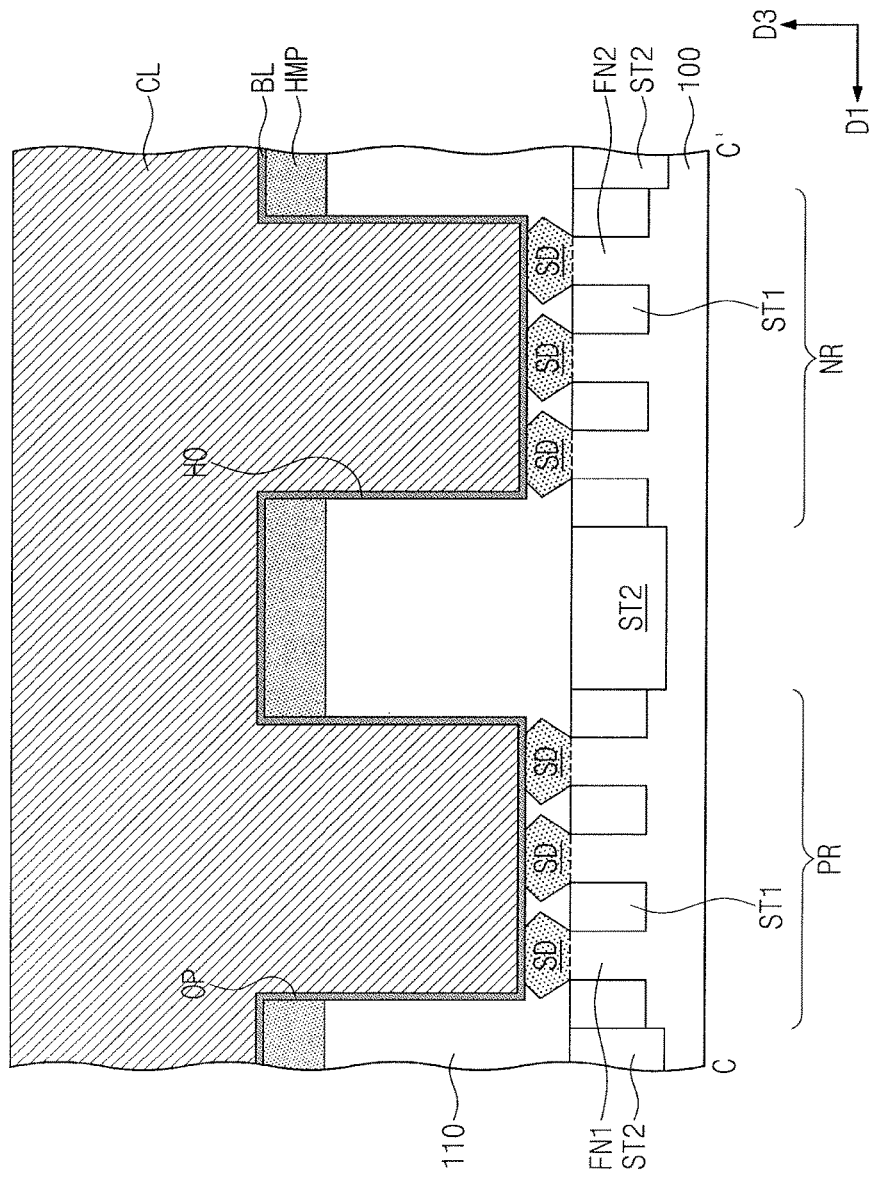
Figure 17:
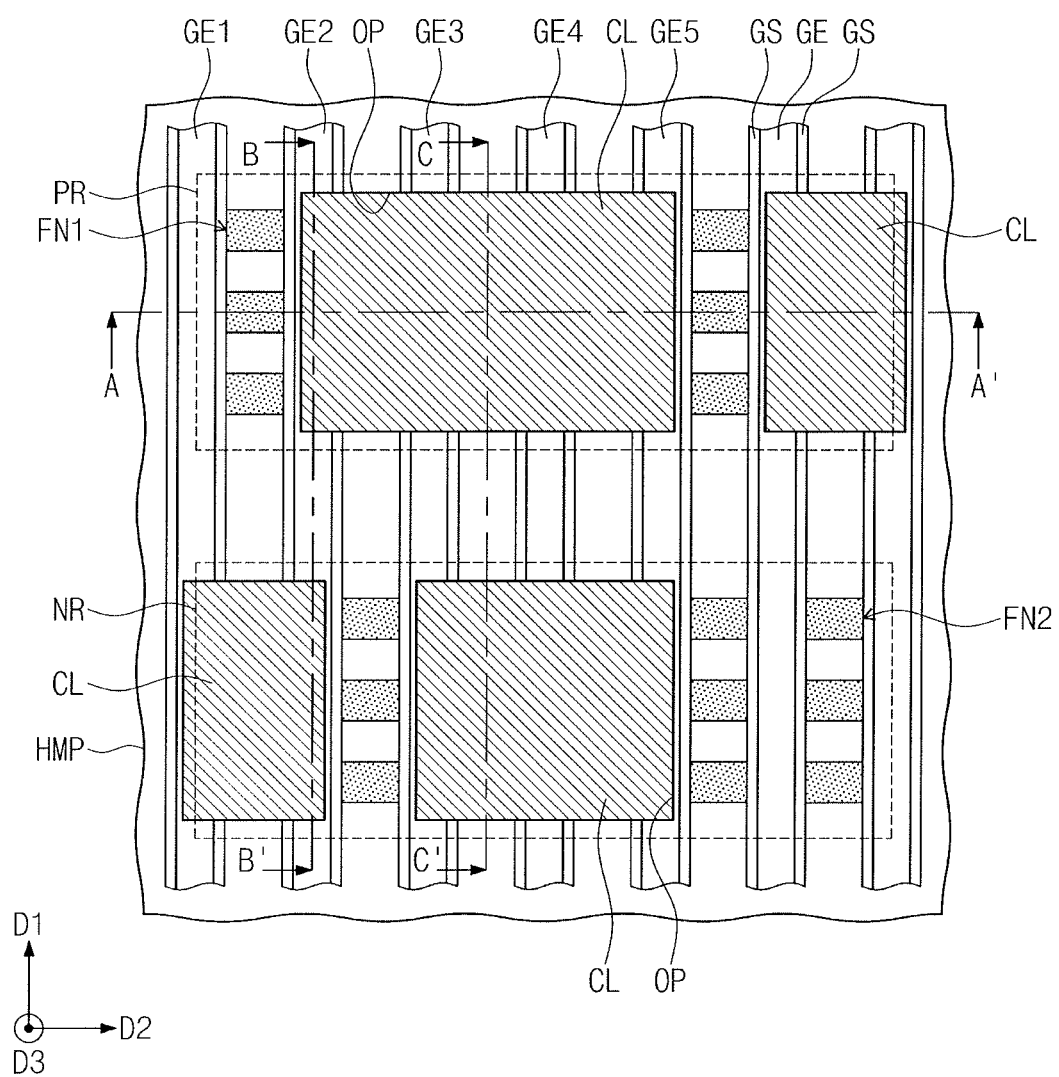

Referring to FIGS. 7 and 8A to 8C, a first interlayer dielectric layer 110 may be formed to cover the source/drain regions SD, the mask patterns MP, and the gate spacers GS, e.g., to cover the structure illustrated in FIG. 6A. For example, the first interlayer dielectric layer 110 may include a silicon oxide layer.

The first interlayer dielectric layer 110 may be planarized until exposing top surfaces of the dummy patterns DP. The mask patterns MP may be completely removed during the planarization process. The planarization process may be performed using an etch-back or CMP (Chemical Mechanical Polishing) process. As a result, the first interlayer dielectric layer 110 may have a top surface substantially coplanar with the top surfaces of the dummy patterns DP and top surfaces of the gate spacers GS. Then, a removal process may be performed to selectively remove the dummy patterns DP whose top surfaces are exposed. The removal of the dummy patterns DP may form trenches TR defined by the gate spacers GS, as illustrated in FIG. 8A. The trenches TR may expose the channel regions AF.

Referring to FIGS. 9 and 10A to 10C, a gate dielectric pattern GI, a gate electrode GE, and a capping pattern CP may be formed in each of the trenches TR. The gate dielectric pattern GI may be conformally formed in the trench TR, e.g., not to completely fill the trench TR. The gate dielectric pattern GI may be formed by atomic layer deposition (ALD) or chemical oxidation. For example, the gate dielectric pattern GI may include a high-k dielectric material. The high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may be formed by forming a gate electrode layer to completely fill the trench TR and planarizing the gate electrode layer. For example, the gate electrode layer may include one or more of conductive metal nitride (e.g., titanium nitride or tantalum nitride) and metal (e.g., titanium, tantalum, tungsten, copper, or aluminum).

The gate electrode GE and the gate dielectric pattern GI in each of the trenches TR may be recessed on their upper portions. The capping pattern CP may be formed on the recessed gate electrode GE and the recessed gate dielectric pattern GI. The capping pattern CP may be formed to fill an upper portion of the trench TR. The capping pattern CP may include one or more of, e.g., SiON, SiCN, SiCON, and SiN. A single gate structure may be constituted by the gate electrode GE, the gate dielectric pattern GI, a pair of the gate spacers GS, and the capping pattern CP that are formed in each of the trenches TR.

For example, the gate electrodes GE may include first to fifth gate electrodes GE1 to GE5 that are arranged in parallel along a second direction D2. First to fifth capping patterns CP1 to CP5 may be disposed on the first to fifth gate electrodes GE1 to GE5, respectively.

Referring to FIGS. 11 and 12A to 12C, a hardmask pattern HMP having openings OP may be formed on the first interlayer dielectric layer 110. The formation of the hardmask pattern HMP may include forming a hardmask layer on the first interlayer dielectric layer 110, forming a photoresist pattern PP on the hardmask layer, and patterning the hardmask layer using the photoresist pattern PP as an etch mask.

The openings OP of the hardmask pattern HMP may vertically overlap the source/drain regions SD. For example, one opening OP of the hardmask pattern HMP may expose the second to fifth capping patterns CP2 to CP5. The opening OP of the hardmask pattern HMP may expose the first interlayer dielectric layer 110 between the second to fifth capping patterns CP2 to CP5.

Referring to FIGS. 13 and 14A to 14C, the hardmask pattern HMP may be used as an etch mask to etch the first interlayer dielectric layer 110 exposed through the openings OP. The photoresist pattern PP may be removed before or during etching the first interlayer dielectric layer 110. The removal of the first interlayer dielectric layer 110 exposed through the openings OP may form holes HO exposing the source/drain regions SD. Each of the holes HO may be formed between a pair of the gate electrodes GE. As the gate electrodes GE are surrounded by the gate spacers GS and the capping patterns CP, the gate electrodes GE may not be exposed through the holes HO.

When the first interlayer dielectric layer 110 is etched, an etching may also be performed on upper portions of the gate spacers GS and the capping patterns CP exposed through the openings OP. For example, the etch process may cause each of the second to fifth capping patterns CP2 to CP5 to have a curved top surface. The first capping pattern CP1 protected by the hardmask pattern HMP may be left intact to have a flat surface.

The first to fifth capping patterns CP1 to CP5 may have top surfaces with heights different from each other. An uppermost height of the first capping pattern CP may be positioned at a first level LV1, and uppermost heights of the third and fourth capping patterns CP3 and CP4 may be positioned at a second level LV2. Top surfaces of the second and fifth capping patterns CP2 and CP5 may be changed from the first level LV1 to a third level LV3. In conclusion, the etch process may change top surface heights of the capping patterns CP and create a non-uniform stepped pattern profile.

Referring to FIGS. 15 and 16A to 16C, a barrier layer BL and a conductive layer CL may be formed to fill the holes HO and the openings OP. The barrier layer BL may be conformally formed not to completely fill the holes HO. For example, the barrier layer BL may include Ti/TiN. The conductive layer CL may be formed on the barrier layer BL to completely fill the holes HO and the openings OP. The conductive layer CL may include a metallic material, e.g., cobalt, tungsten, or copper. The barrier layer BL and the conductive layer CL may be formed to cover an entire top surface of the hardmask pattern HMP.

Referring to FIGS. 17 and 18A to 18C, a first planarization process may be performed to expose the top surface of the hardmask pattern HMP. The first planarization process may be performed using the hardmask pattern HMP as a stop layer. The first planarization process may remove the conductive layer CL and the barrier layer BL that are positioned above the hardmask pattern HMP.

For example, the first planarization process may use a chemical mechanical polishing (CMP) process. The CMP process may be a planarization process in which slurry containing abrasive particles and chemical additives is used to carry out chemical and mechanical polishing on a polish target material. In order to polish a metal layer such as the conductive layer CL and the barrier layer BL, the slurry may include abrasive particles, an oxidizing agent, a pH modifier, and so forth. The abrasive particles may include silica particles or alumina particles. The oxidizing agent may include hydrogen peroxide, ferric nitrate, or persulfate, which oxidizes a surface of the metal layer. The pH modifier may adjust pH of the slurry in order to enhance polishing characteristics of the metal layer. The pH modifier may be a base including, e.g., potassium hydroxide (KOH), ammonium hydroxide ($NH_4OH$), trimethylamine (TMA), triethylamine (TEA), and/or tetramethylammonium hydroxide (TMAH). The pH modifier may adjust the slurry to have a pH range from 7 to 12.

The metal layer may chemically react with the oxidizing agent to form a metal oxide layer on its surface. The metal oxide layer may be formed on an uppermost portion of the metal layer, and removed by a polishing process using the abrasive particles. This procedure may be repeated to planarize the metal layer.

A first slurry composition may be used to perform the first planarization process. The first slurry composition may etch the conductive layer CL at a first etch rate greater than a second etch rate at which the hardmask pattern HMP is etched. For example, the first etch rate may be 10 to 50 times the second etch rate. The etch rate of the first slurry composition may be determined by adjusting the kind and composition ratio of the oxidizing agent and the pH modifier in the first slurry composition.

Referring to FIGS. 19 and 20A to 20C, a second planarization process may be performed until an upper surface of an upper portion BLt of the barrier layer BL covering the top surfaces of the capping patterns CP is exposed. The second planarization process may be performed using the barrier layer BL as a stop layer. The second planarization process may stop when a pattern density of the barrier layer BL reaches a predetermined pattern density or above. For example, the second planarization process may use a chemical mechanical polishing (CMP) process.

Figure 18A:
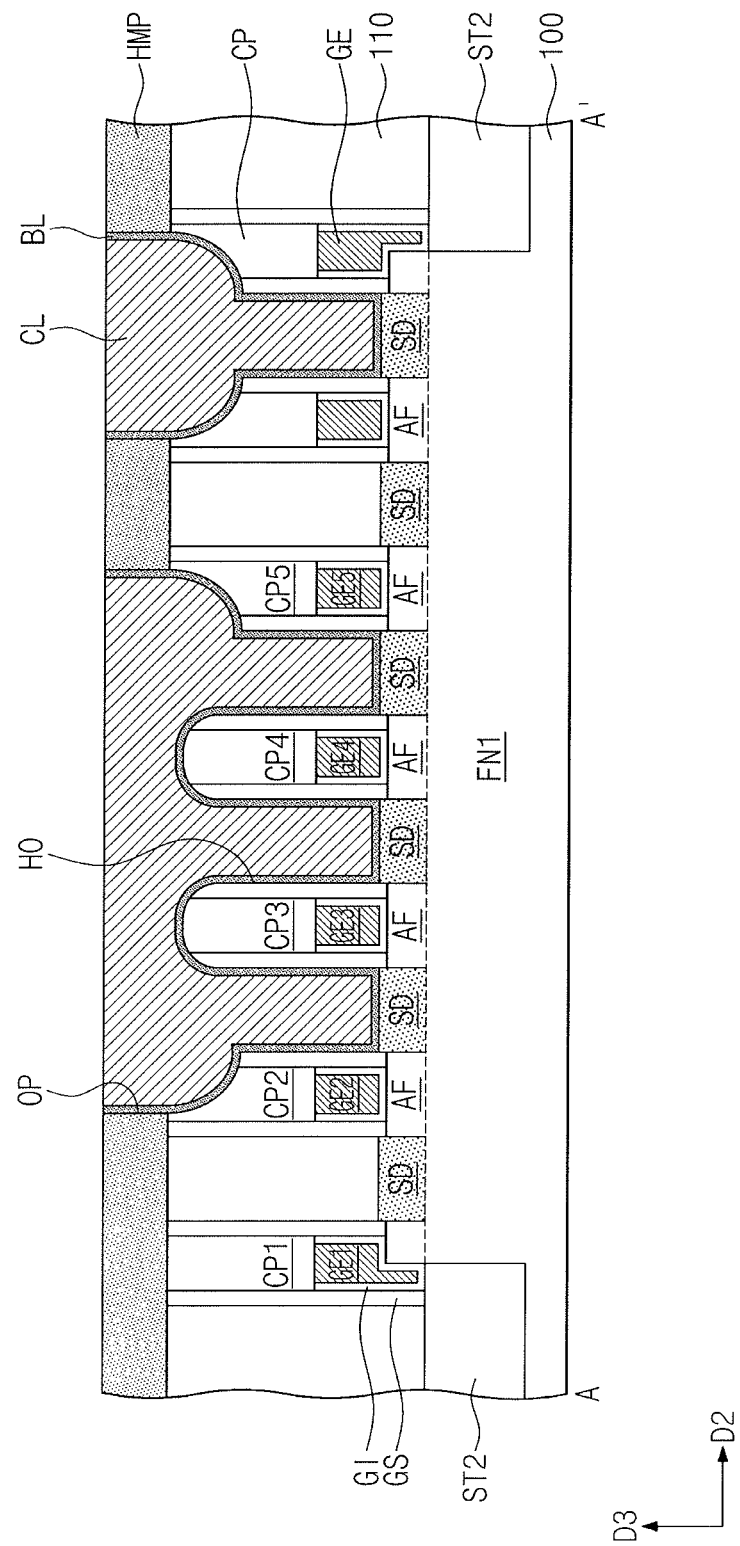
Figure 18B:
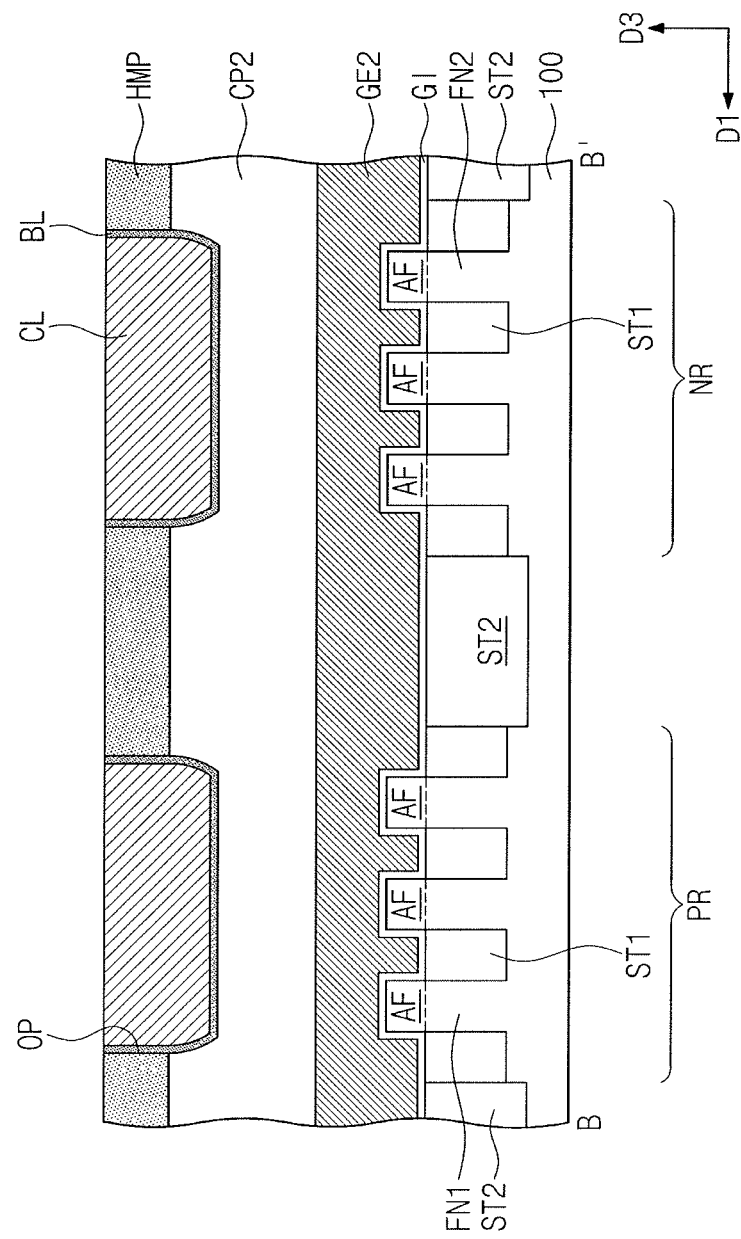
Figure 19:
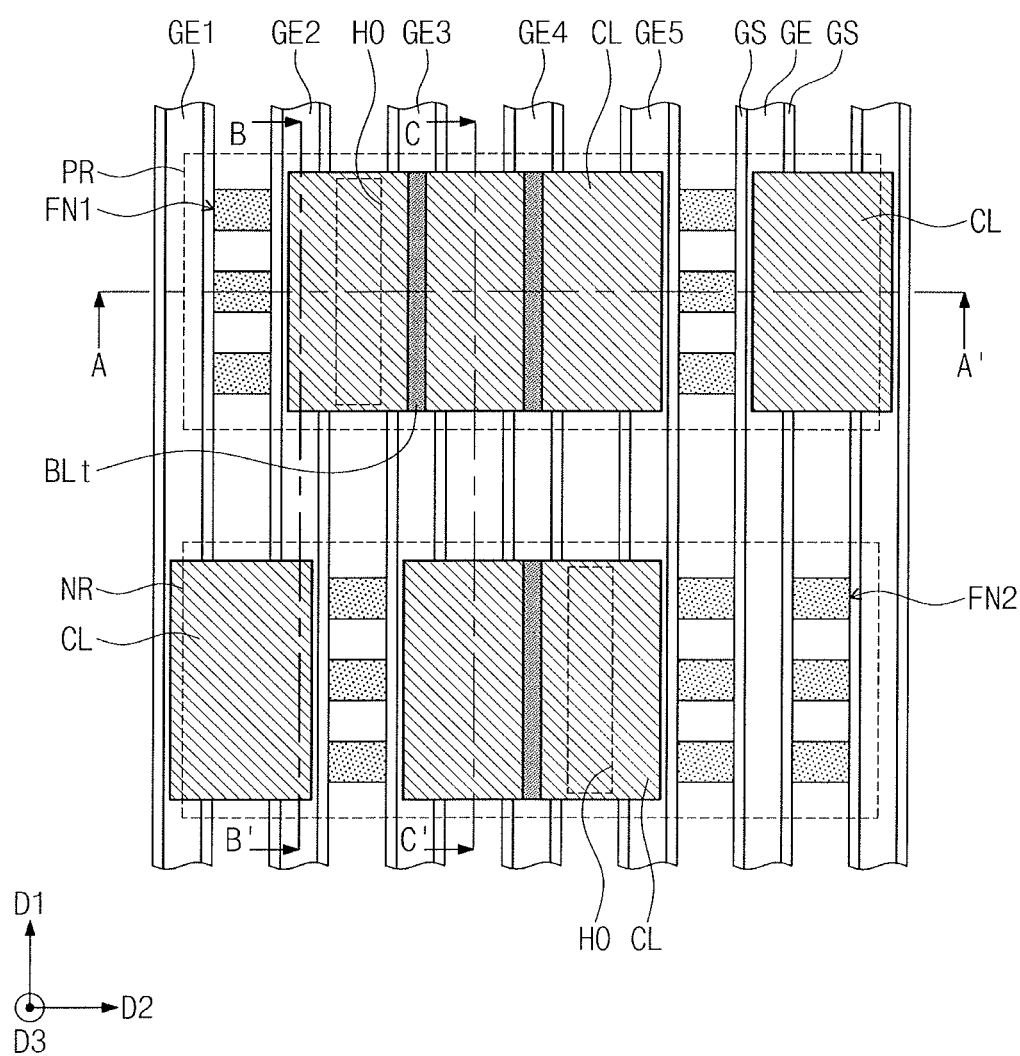
Figure 20A:
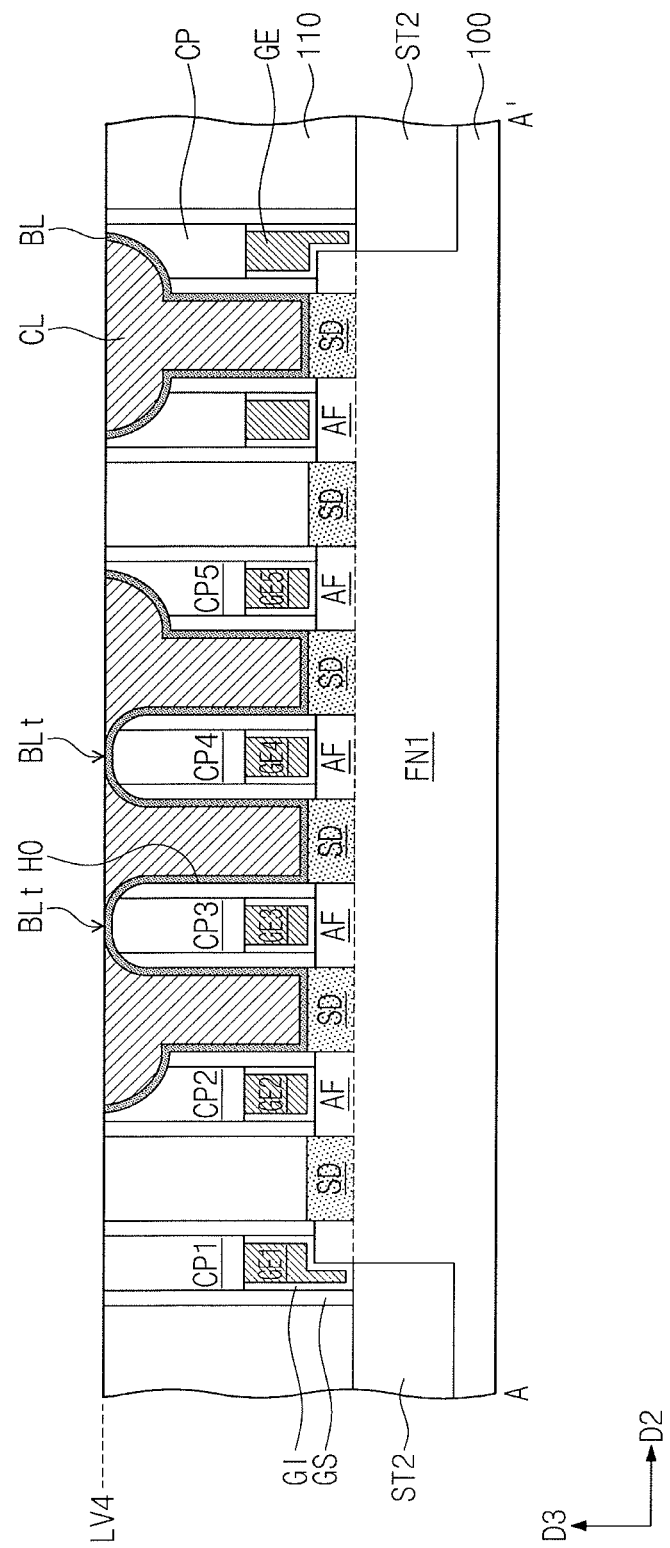
Figure 20B:
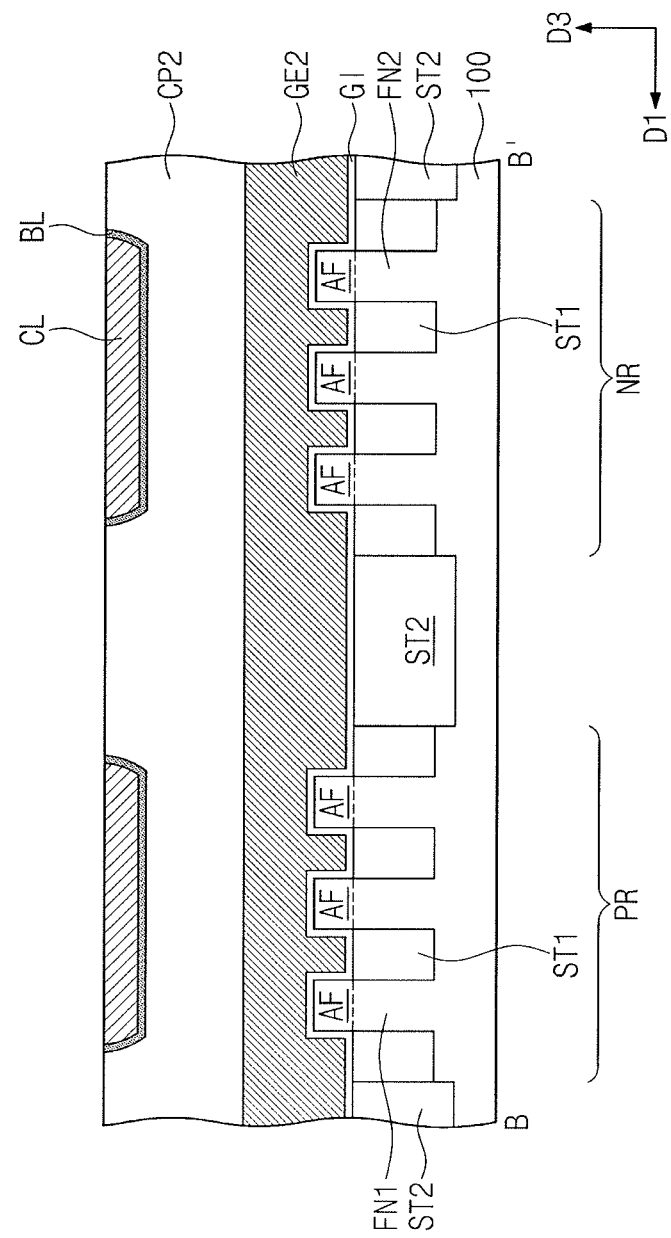
Figure 20C:
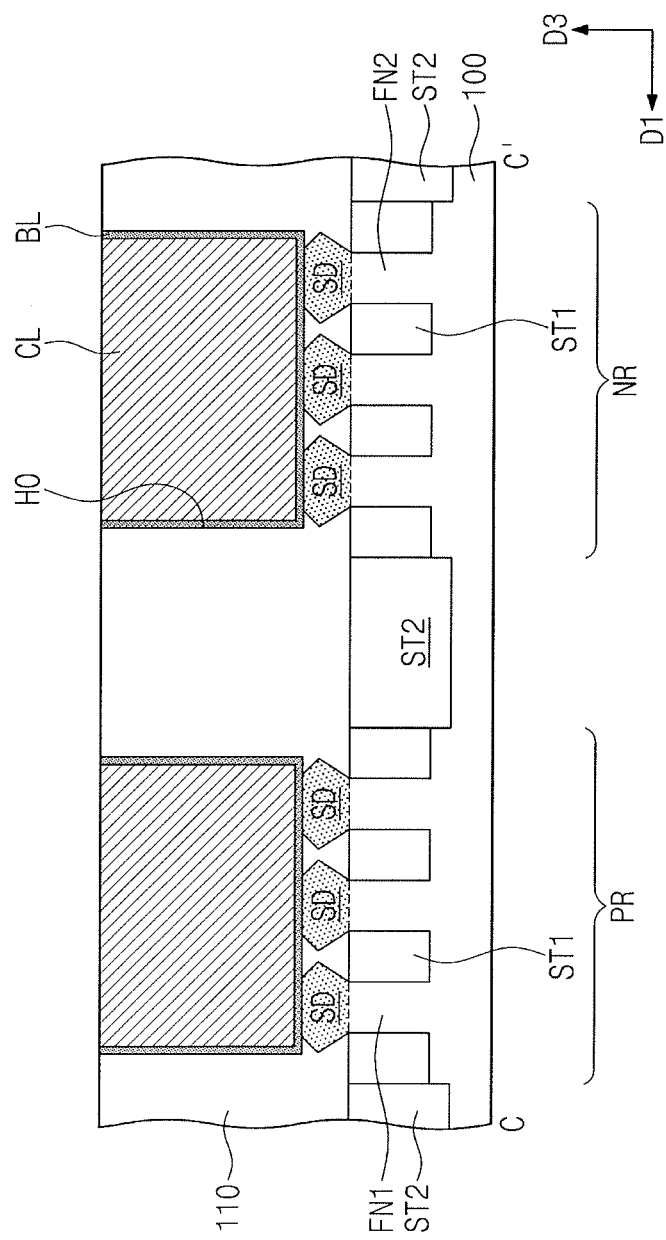
Figure 21:
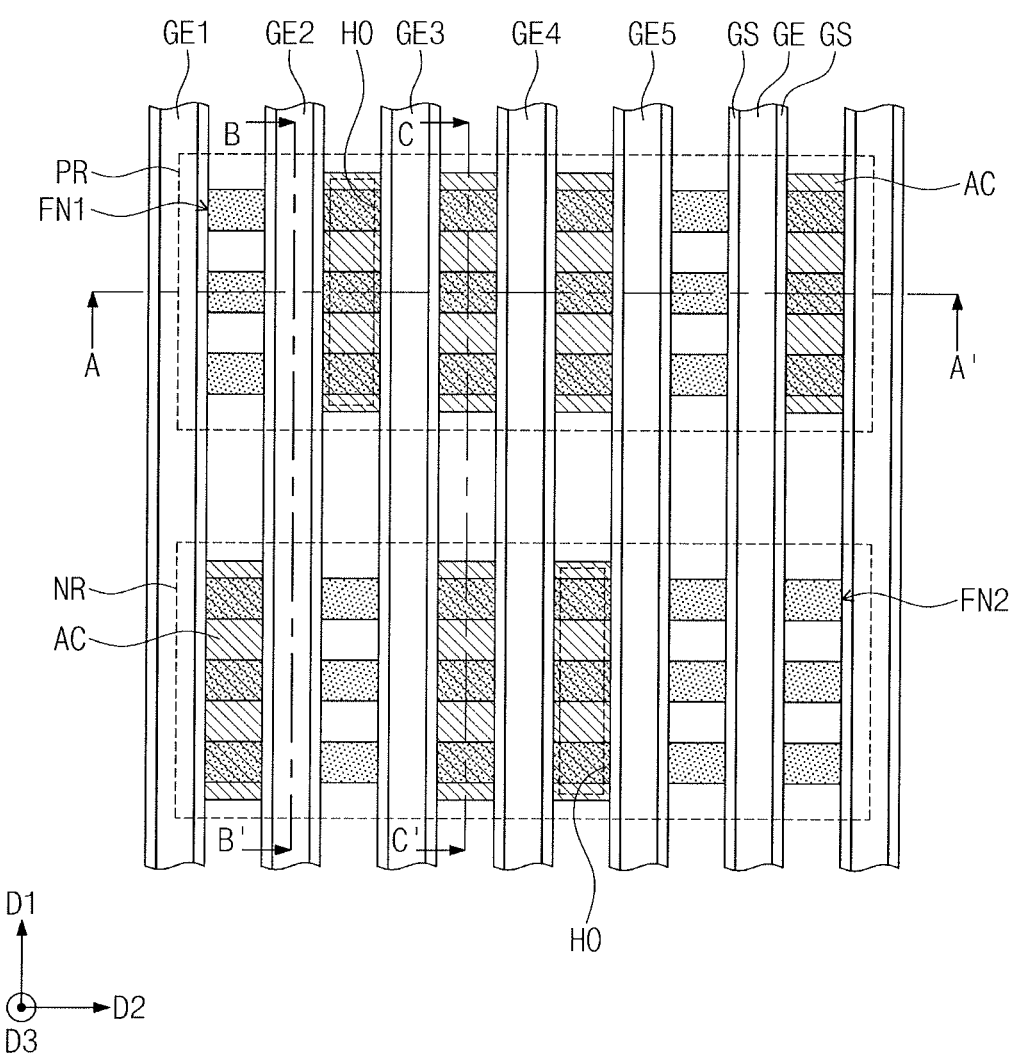
Figure 22A:
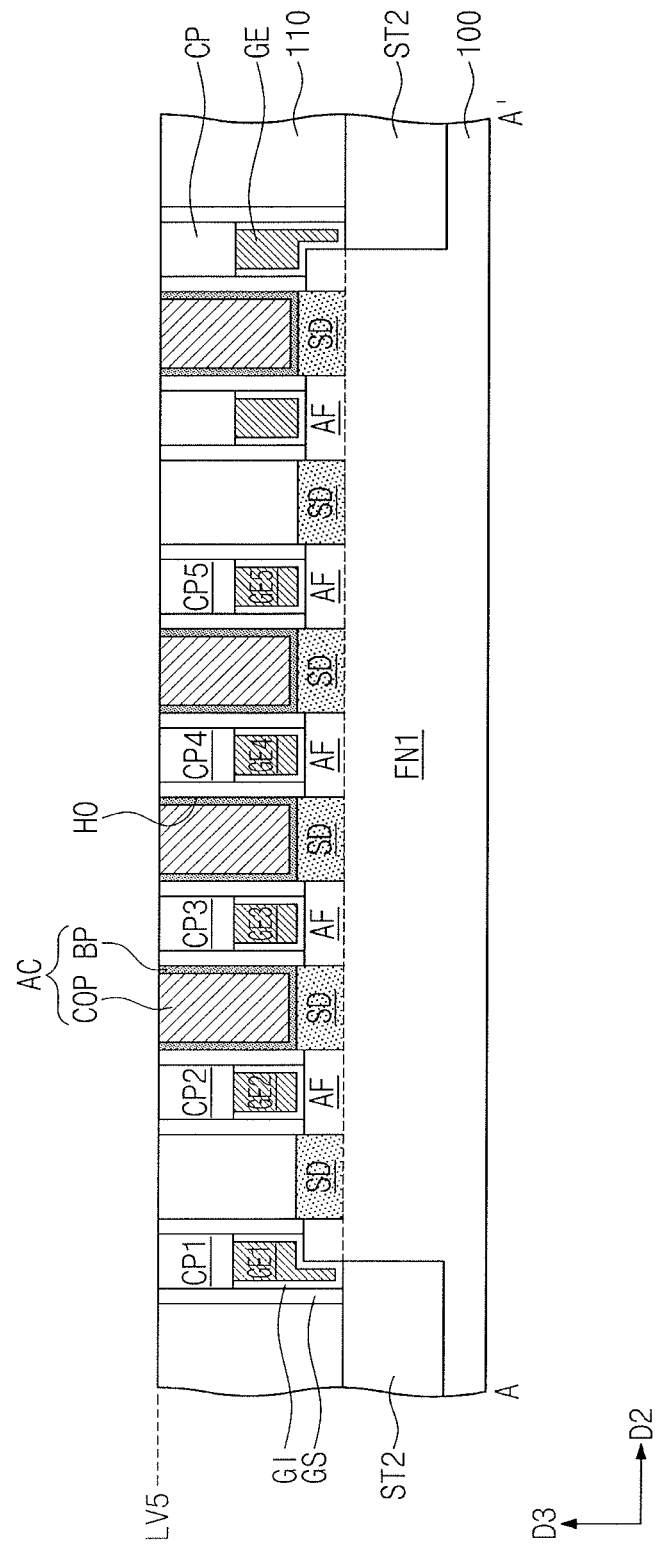
Figure 22B:
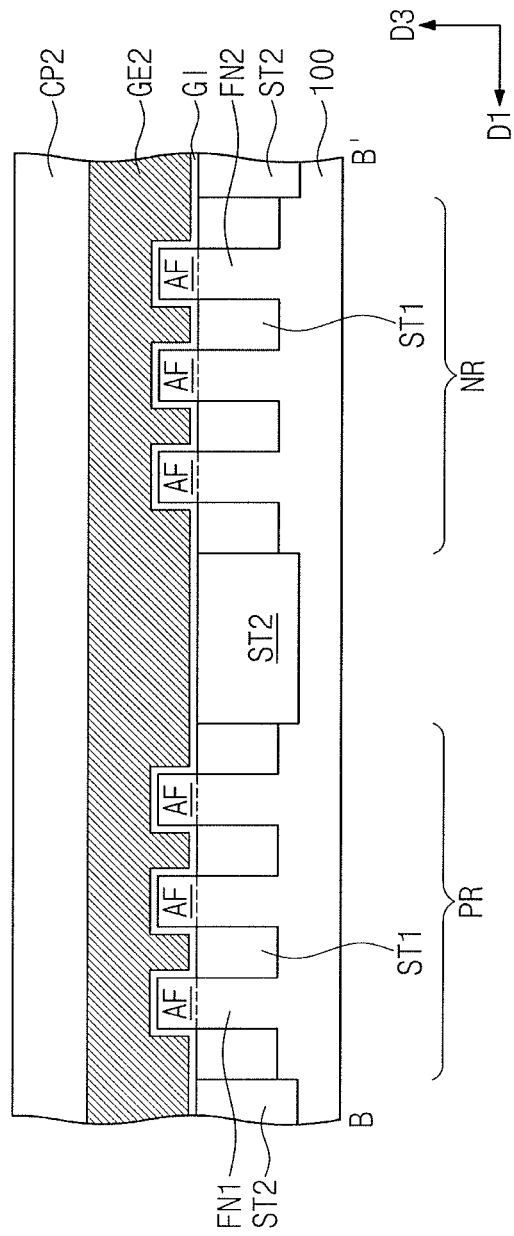
Figure 22C:
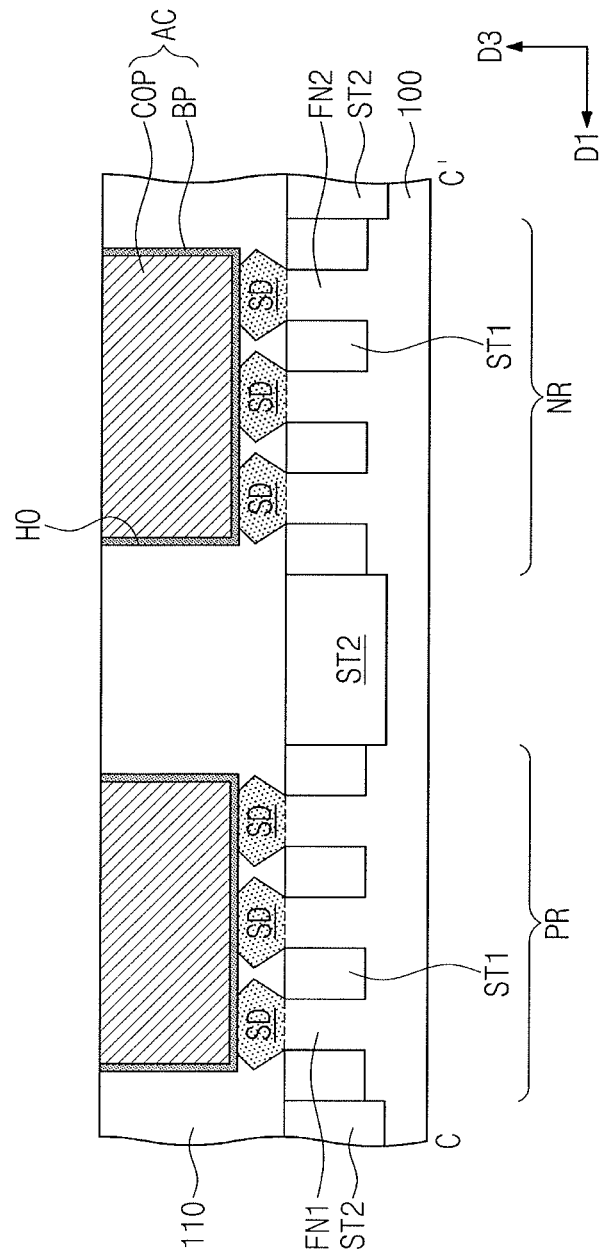

For example, the upper portion BLt of the barrier layer BL covering the third and fourth capping patterns CP3 and CP4 may be positioned at a fourth level LV4. The barrier layer BL may have a relatively smaller exposed area before the second planarization process reaches the fourth level LV4, e.g., the barrier layer BL may have a linear shape along a vertical direction with a narrow width above the fourth level LV4. As the upper portion BLt of the barrier layer BL is positioned on relatively flatter surfaces of the third and fourth capping patterns CP3 and CP4, the exposed area of the barrier layer BL may become relatively greater when the second planarization process reaches the fourth level LV4, e.g., the barrier layer BL may change from the vertical linear shape into a horizontal linear shape at the fourth level LV4 (FIG. 18A). Therefore, when the second planarization process reaches the fourth level LV4, the pattern density of the barrier layer BL may reach the predetermined pattern density or above, and at this time, the second planarization process may stop, e.g., the increased width of the exposed barrier layer BL along the second direction D2 may act as an etch stop layer to stop the second planarization process. The second planarization process may remove the conductive layer CL, the first interlayer dielectric layer 110, the capping patterns CP, the gate spacers GS, and the hardmask pattern HMP that are positioned above the fourth level LV4.

A second slurry composition may be used to perform the second planarization process. The second slurry composition may etch the conductive layer CL at a first etch rate greater than a second etch rate at which the barrier layer BL is etched. For example, the first etch rate may be 10 to 50 times the second etch rate. The etch rate of the second slurry composition may be determined by adjusting the kind and composition ratio of the oxidizing agent and the pH modifier in the second slurry composition. The second slurry composition used for the second planarization process may have its composition (or composition ratio) different from that of the first slurry composition used for the first planarization process.

Referring to FIGS. 21 and 22A to 22C, a third planarization process may be performed until all of the capping patterns CP are completely exposed. The third planarization process may be performed using the capping patterns CP as a stop layer. The third planarization process may stop at a time when a pattern density of the capping patterns CP reaches a predetermined pattern density or above, e.g., the third planarization process may stop when the capping patterns CP reach a predetermined pattern width along the second direction D2. For example, the third planarization process may use a chemical mechanical polishing (CMP) process.

For example, a lowermost height of the capping patterns CP covered with the barrier layer BL may be positioned at a fifth level LV5. Before the third planarization process reaches the fifth level LV5, all of the capping patterns CP may not be completely exposed such that the capping patterns CP may have a relatively smaller exposed area, e.g., a relatively small width along the second direction D2. When the third planarization process reaches the fifth level LV5, all of the capping patterns CP may be completely exposed, e.g., a maximum width along the second direction D2 may be exposed, to expose a relatively large area of the capping patterns CP. In conclusion, when the third planarization process reaches the fifth level LV5, the pattern density, e.g., width, of the capping patterns CP may reach the predetermined pattern density or above, and the third planarization process may stop.

The third planarization process may remove the conductive layer CL, the first interlayer dielectric layer 110, the capping patterns CP, and the, gate spacers GS that are positioned above the fifth level LV5. A third slurry composition may be used to perform the third planarization process. The third slurry composition may etch the conductive layer CL at a first etch rate greater than a second etch rate at which the capping patterns CP are etched. For example, the first etch rate may be 10 to 50 times the second etch rate. The etch rate of the third slurry composition may be determined by adjusting the kind and composition ratio of the oxidizing agent and the pH modifier in the third slurry composition. The third slurry composition used for the third planarization process may have its composition (or composition ratio) different from those of the first and second slurry compositions respectively used for the first and second planarization processes.

Through the first to third planarization processes, the barrier layer BL and the conductive layer CL may be etched to form active contacts AC. The active contacts AC may be selectively formed in the holes HO. For example, there may be spacing distances between ones of a first active contact AC between the second and third gate electrodes GE2 and GE3, a second active contact AC between the third and fourth gate electrodes GE3 and GE4, and a third active contact AC between the fourth and fifth gate electrodes GE4 and GE5. As discussed above, after one opening OP is formed and then filled with the barrier layer BL and the conductive layer CL, the first to third planarization processes may be carried out. As a result, the mutually separate first to third active contacts AC may be self-alignedly formed.

Referring back to FIGS. 1 and 2A to 2C, a second interlayer dielectric layer 120 may be formed on the first interlayer dielectric layer 110. For example, the second interlayer dielectric layer 120 may include a silicon oxide layer or a low-k oxide layer. First contacts CT1 and a second contact CT2 may be formed in the second interlayer dielectric layer 120. The formation of the first and second contacts CT1 and CT2 may include forming contact holes to penetrate the second interlayer dielectric layer 120, forming a barrier layer and a conductive layer to fill the contact holes, and planarizing the barrier layer and the conductive layer.

A third interlayer dielectric layer 130 may be formed on the second interlayer dielectric layer 120. For example, the third interlayer dielectric layer 130 may include a silicon oxide layer or a low-k oxide layer. First and second power lines PL1 and PL2 and conductive lines ML may be formed in the third interlayer dielectric layer 130. For example, a dual damascene process may be used to form the first and second power lines PL1 and PL2 and the conductive lines ML.

By way of summation and review, embodiments provide a method of manufacturing a semiconductor device having enhanced electrical characteristics. That is, in a method of manufacturing a semiconductor device according to exemplary embodiments, a three-step planarization process (i.e., the first to third planarization processes) may be employed to etch the barrier layer BL and the conductive layer CL formed on the capping patterns CP having non-uniform heights. The first to third planarization processes may be performed using different slurry compositions and stop layers. It may thus be possible to self-alignedly form the completely separated active contacts AC without a short therebetween.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming on a substrate first to fourth gate electrodes adjacent to each other, the first to fourth gate electrodes extending in a first direction and being spaced apart from each other in a second direction crossing the first direction;
   forming first to fourth capping patterns on the first to fourth gate electrodes, respectively;
   forming an interlayer dielectric layer filling spaces between adjacent ones of the first to fourth gate electrodes;
   forming a hardmask pattern on the interlayer dielectric layer, the hardmask pattern including an opening that selectively exposes the second to fourth capping patterns;
   forming holes by using the hardmask pattern as an etch mask to etch the interlayer dielectric layer between the second and third gate electrodes and between the third and fourth gate electrodes;
   sequentially forming a barrier layer and a conductive layer that fill the holes;
   performing a first planarization process until the hardmask pattern is exposed;
   performing a second planarization process until a portion of the barrier layer is exposed, the portion of the barrier layer covering the second to fourth capping patterns; and
   performing a third planarization process until the first to fourth capping patterns are completely exposed.

2. The method as claimed in claim 1, wherein upper portions of the second to fourth capping patterns are etched during etching of the interlayer dielectric layer.

3. The method as claimed in claim 1, wherein, after the barrier layer and the conductive layer are formed, an uppermost height of the first capping pattern is greater than an uppermost height of the third capping pattern.

4. The method as claimed in claim 1, wherein, after the barrier layer and the conductive layer are formed, each of the second to fourth capping patterns has a curved top surface.

5. The method as claimed in claim 1, further comprising:
   forming an active pattern at an upper portion of the substrate; and
   forming source/drain regions at the active pattern, such that the source/drain regions are positioned between the first to fourth gate electrodes, in plan view,
   wherein the holes expose the source/drain regions.

6. The method as claimed in claim 5, further comprising:
forming a device isolation layer covering the active pattern; and
recessing the device isolation layer to expose an upper portion of the active pattern.

7. The method as claimed in claim 1, further comprising forming a pair of gate spacers on opposite sides of each of the first to fourth gate electrodes, such that the pair of gate spacers prevent the second to fourth gate electrodes from being exposed through the holes.

8. The method as claimed in claim 1, wherein:
the first planarization process uses a first slurry composition, the second planarization process uses a second slurry composition, and the third planarization process uses a third slurry composition,
the first slurry composition etches the conductive layer at an etch rate greater than an etch rate at which the hardmask pattern is etched,
the second slurry composition etches the conductive layer at an etch rate greater than an etch rate at which the barrier layer is etched, and
the third slurry composition etches the conductive layer at an etch rate greater than an etch rate at which the first to fourth capping patterns are etched.

9. The method as claimed in claim 1, wherein the second planarization process stops when a pattern density of the barrier layer reaches a predetermined pattern density or above.

10. The method as claimed in claim 1, wherein the third planarization process stops when a pattern density of the first to fourth capping patterns reaches a predetermined pattern density or above.

11. A method of manufacturing a semiconductor device, the method comprising:
forming gate structures on a substrate;
forming an interlayer dielectric layer filling spaces between the gate structures;
forming a hardmask pattern on the interlayer dielectric layer, such that the hardmask pattern partially exposes the gate structures;
etching the interlayer dielectric layer using the hardmask pattern as an etch mask;
sequentially forming a barrier layer and a conductive layer on an entire surface of the substrate;
performing a first planarization process until the hardmask pattern is exposed;
performing a second planarization process until a portion of the barrier layer is exposed, the exposed portion of the barrier layer covering top surfaces of the gate structures; and
performing a third planarization process until capping patterns of the gate structures are completely exposed,
wherein, after the barrier layer and the conductive layer are formed, the gate structures have uppermost heights that are different from each other.

12. The method as claimed in claim 11, wherein, after the barrier layer and the conductive layer are formed, each of the gate structures has a curved top surface.

13. The method as claimed in claim 11, wherein the second planarization process stops when a pattern density of the barrier layer reaches a predetermined pattern density or above.

14. The method as claimed in claim 11, wherein the third planarization process stops when a pattern density of the capping patterns of the gate structures reaches a predetermined pattern density or above.

15. The method as claimed in claim 11, further comprising:
forming an active pattern at an upper portion of the substrate; and
forming source/drain regions at the active pattern, such that the source/drain regions are positioned between the gate structures, in plan view,
wherein the interlayer dielectric layer is etched to form holes that expose the source/drain regions.

16. A method of manufacturing a semiconductor device, the method comprising:
forming on a substrate first to fourth gate electrodes adjacent to each other, the first to fourth gate electrodes extending in a first direction and being spaced apart from each other in a second direction crossing the first direction;
forming first to fourth capping patterns on the first to fourth gate electrodes, respectively;
forming an interlayer dielectric layer filling spaces between adjacent ones of the first to fourth gate electrodes;
forming a hardmask pattern on the interlayer dielectric layer, the hardmask pattern including an opening that selectively exposes the second to fourth capping patterns;
forming holes by using the hardmask pattern as an etch mask to etch the interlayer dielectric layer between the second and third gate electrodes and between the third and fourth gate electrodes;
sequentially forming a barrier layer and a conductive layer that fill the holes;
performing a first planarization process until the hardmask pattern is exposed;
performing a second planarization process until a portion of the barrier layer is exposed, the portion of the barrier layer covering the second to fourth capping patterns; and
performing a third planarization process until the first to fourth capping patterns are completely exposed,
wherein each of the first through third planarization process is performed using a different slurry composition.

17. The method as claimed in claim 16, wherein, after the barrier layer and the conductive layer are formed, uppermost heights of the first through fourth capping patterns are non-uniform.

18. The method as claimed in claim 16, wherein:
a slurry composition in the first planarization process etches the conductive layer at an etch rate greater than an etch rate at which the hardmask pattern is etched,
a slurry composition of the second planarization process etches the conductive layer at an etch rate greater than an etch rate at which the barrier layer is etched, and
a slurry composition of the third planarization process etches the conductive layer at an etch rate greater than an etch rate at which the first to fourth capping patterns are etched.

19. The method as claimed in claim 18, wherein:
the slurry composition in the first planarization process etches the conductive layer at an etch rate that is at least 10 times greater than an etch rate at which the hardmask pattern is etched,
the slurry composition of the second planarization process etches the conductive layer at an etch rate that is at least 10 times greater than an etch rate at which the barrier layer is etched, and the slurry composition of the third planarization process etches the conductive layer at an etch rate that is at last 10 times greater than an etch rate at which the first to fourth capping patterns are etched.

20. The method as claimed in claim 16, wherein:

the first planarization process is performed until an upper surface of the hardmask pattern is exposed, the second planarization process is performed until an upper surface of the portion of the barrier layer covering the second to fourth capping patterns is exposed, the upper surface of the portion of the barrier layer covering the second to fourth capping patterns is at least partially flat; and the third planarization process is performed until the first to fourth capping patterns are completely exposed, such that a widest width of each of the first to fourth capping patterns is exposed.

* * * * *